(12) United States Patent
Cha et al.

(10) Patent No.: US 11,630,632 B2
(45) Date of Patent: Apr. 18, 2023

(54) PIXEL ARRANGEMENT OF DISPLAY DEVICE AND TILED DISPLAY INCLUDING THE SAME

(71) Applicant: Samsung Display Co., LTD., Yongin-si (KR)

(72) Inventors: Nahyeon Cha, Yongin-si (KR); Sunkwun Son, Suwon-si (KR); Dong Hee Shin, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/518,723

(22) Filed: Nov. 4, 2021

(65) Prior Publication Data

US 2022/0269466 A1    Aug. 25, 2022

(30) Foreign Application Priority Data

Feb. 25, 2021  (KR) .................. 10-2021-0025892

(51) Int. Cl.
  *G06F 3/14*   (2006.01)
  *H01L 27/32*  (2006.01)

(52) U.S. Cl.
  CPC ........ *G06F 3/1446* (2013.01); *H01L 27/3216* (2013.01); *H01L 27/3218* (2013.01); *H01L 27/3293* (2013.01)

(58) Field of Classification Search
  CPC .............. G06F 3/1446; H01L 27/3216; H01L 27/3218; H01L 27/3293
  See application file for complete search history.

(56) References Cited

U.S. PATENT DOCUMENTS

| 5,889,568 | A  | * | 3/1999  | Seraphim ............. G02F 1/1333 349/1 |
| 9,697,760 | B2 |   | 7/2017  | Wang |
| 10,763,318 | B2 | * | 9/2020 | Liu .................... H01L 27/3255 |
| 2010/0045695 | A1 | * | 2/2010 | Brown Elliott ...... G09G 3/2003 345/589 |
| 2019/0179591 | A1 | * | 6/2019 | Kuo ...................... G09F 9/3026 |
| 2020/0381410 | A1 | * | 12/2020 | Yueh .................... H01L 25/167 |
| 2021/0217806 | A1 | * | 7/2021  | Xi ....................... H01L 33/0095 |

FOREIGN PATENT DOCUMENTS

| KR | 1020190014216 A | 2/2019 |
| KR | 1020200020470 A | 2/2020 |
| KR | 1020200024930 A | 3/2020 |
| KR | 1020200034909 A | 4/2020 |

* cited by examiner

Primary Examiner — Kwang-Su Yang
(74) Attorney, Agent, or Firm — Cantor Colburn LLP

(57) ABSTRACT

A display device includes a tiled display structure including a first display panel, a second display panel adjacent to a first side of the first display panel, a third display panel adjacent to a second side of the first display panel, and a fourth display panel adjacent to a first side of the third display panel and a first side of the second display panel. Each of the first to fourth display panels includes a display area and a pad area, and each of the first to fourth display panels includes a plurality of pixels in the display area. Each of the pixels includes at least two sub-pixels. When viewed in a plan view of the tiled display structure, the at least two sub-pixels included in each of the pixels are repeatedly arranged in a row direction and a column direction on a plane of the tiled display structure.

20 Claims, 17 Drawing Sheets

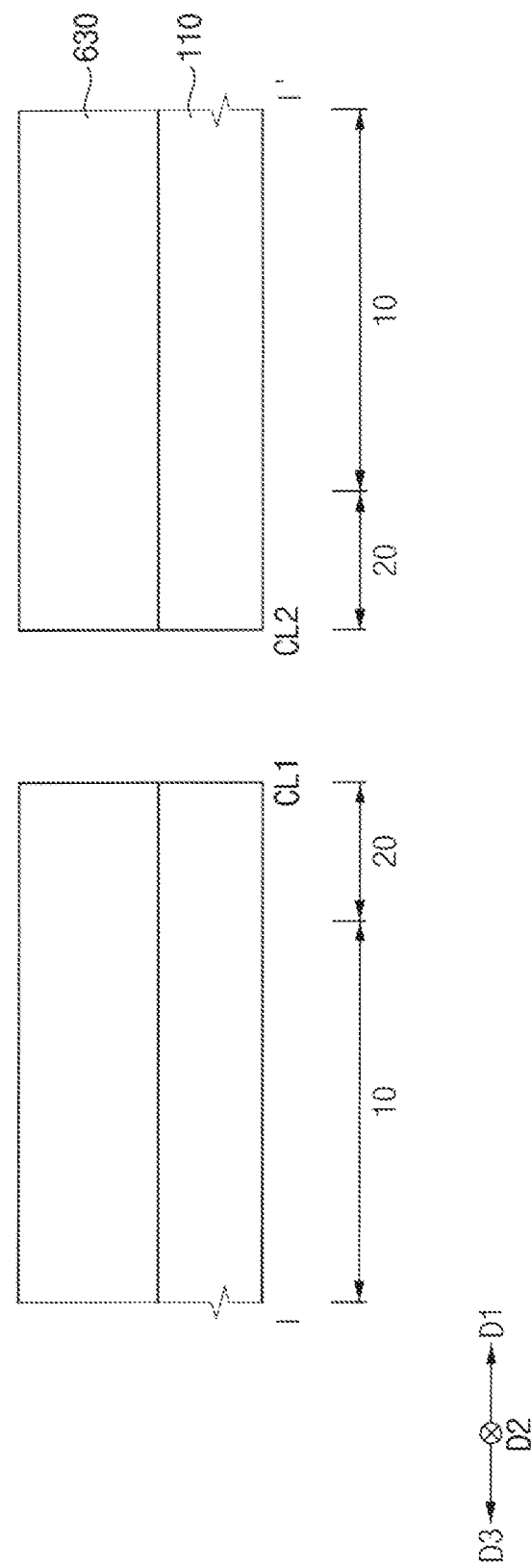

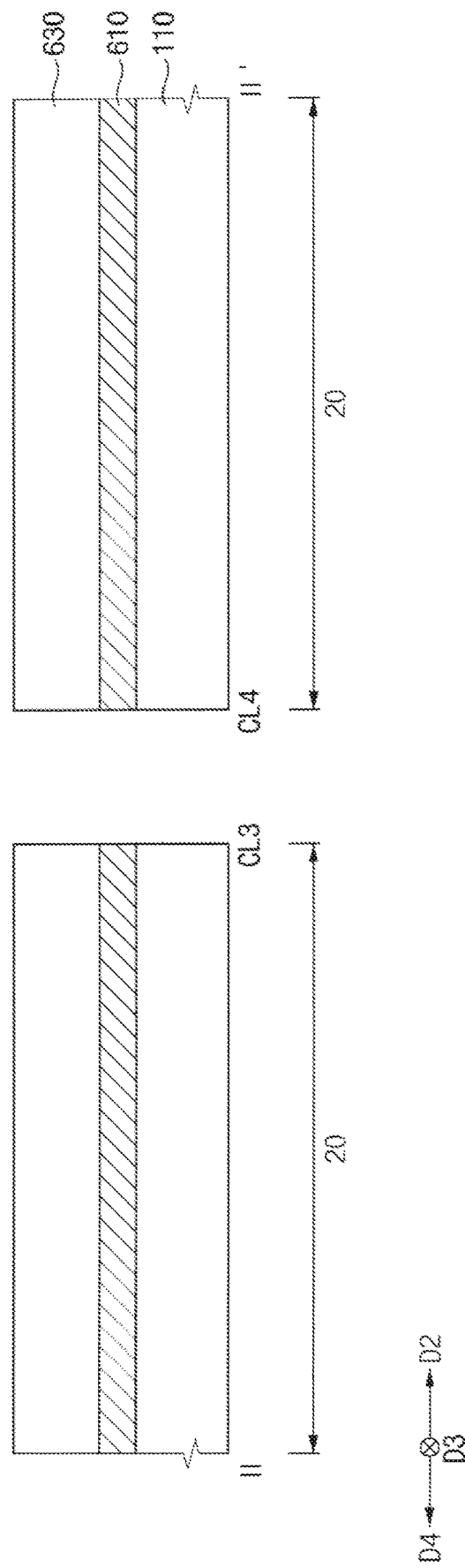

PIXEL ARRANGEMENT OF DISPLAY DEVICE AND TILED DISPLAY INCLUDING THE SAME

This application claims priority to Korean Patent Application No. 10-2021-0025892 filed on Feb. 25, 2021, and all the benefits accruing therefrom under 35 U.S.C. § 119, the entire disclosure of which is incorporated herein by reference.

BACKGROUND

1. Field

Embodiments relate generally to a display device. More particularly, embodiments relate to a display device including display panels.

2. Description of the Related Art

Flat panel display devices are used as display devices for replacing a cathode ray tube display device due to lightweight and thin characteristics of the flat panel display devices. As representative examples of such flat panel display devices, there are a liquid crystal display device and an organic light emitting diode display device.

Aa display device in which at least two display panels are coupled to each other to implement a large display panel (e.g., a tiled display device) has been developed. The tiled display device may include first to fourth display panels. In this case, the first to fourth display panels may be display panels having a same structure, and each of the first to fourth display panels may be provided on one side thereof with a pad area in which pad electrodes electrically connected to an external device are disposed.

In a tiled display device, one side of the first display panel may be connected to the second display panel. In addition, another side of the first display panel may be connected to the third display panel. In this case, due to the pad area of the third display panel, the third display panel may be rotated by 180 degrees and connected to the first display panel. Moreover, one side of the second display panel and one side of the third display panel may be connected to the fourth display panel. In this case, due to the pad area of the fourth display panel, the fourth display panel may be rotated by 180 degrees and connected to the second and third display panels. Accordingly, the first to fourth display panels may be connected to each other in two rows and two columns.

SUMMARY

Embodiments provide a display device including display panels.

According to embodiments, a display device includes a tiled display structure including a first display panel, a second display panel adjacent to a first side of the first display panel, a third display panel adjacent to a second side of the first display panel, and a fourth display panel adjacent to a first side of the third display panel and a first side of the second display panel. Each of the first to fourth display panels includes a display area and a pad area, and each of the first to fourth display panels includes a plurality of pixels in the display area. Each of the pixels includes at least two sub-pixels. When viewed in a plan view of the tiled display structure, the at least two sub-pixels included in each of the pixels are repeatedly arranged in a row direction and a column direction on a plane of the tiled display structure.

In embodiments, the pixels included in each of the first to fourth display panels may have a same structure.

In embodiments, the first and second display panels may be adjacent to each other in the row direction so that the first display panel and the second display panel are symmetrical with each other in the column direction. The first and third display panels may be adjacent to each other in the column direction while the third display panel is rotated by 180 degrees so that the first display panel and the third display panel are symmetrical with each other in the row direction. The second and fourth display panels may be adjacent to each other in the column direction while the fourth display panel is rotated by 180 degrees so that the second display panel and the fourth display panel are symmetrical with each other in the row direction.

In embodiments, the display device may further include a conductive film layer between the first display panel and the second and third display panels and between the fourth display panel and the second and third display panels.

In embodiments, the first display panel and the third display panel may be symmetrical with each other about the conductive film layer between the first and third display panels, and the second display panel and the fourth display panel may be symmetrical with each other about the conductive film layer between the second and fourth display panels.

In embodiments, the first display panel and the second display panel may be symmetrical with each other about the conductive film layer between the first and second display panels, and the third display panel and the fourth display panel may be symmetrical with each other about the conductive film layer between the third and fourth display panels.

In embodiments, the tiled display structure may further include an outer periphery power supply wire and a connection wire, which surround an outermost periphery of the first to fourth display panels.

In embodiments, the outer periphery power supply wire may be separated between the first display panel and the second and third display panels and between the fourth display panel and the second and third display panels.

In embodiments, the conductive film layer may be interposed in a space obtained by the separation between respective display panels, and the outer periphery power supply wire and the connection wire may conduct electricity through the conductive film layer.

In embodiments, the tiled display structure may further include an inner power supply wire in a lattice shape in the display area of each of the first to fourth display panels.

In embodiments, the pad area may be located in a third side of the first display panel facing the second side of the first display panel. The first display panel may be adjacent to a second side of the third display panel, and the pad area may be located in a third side of the third display panel facing the second side of the third display panel.

In embodiments, the pad area of the first display panel and the pad area of the third display panel may face each other.

In embodiments, the first display panel may be adjacent to a second side of the second display panel, and the pad area of the second display panel may be in a third side of the second display panel facing the first side of the second display panel. The second display panel may be adjacent to a first side of the fourth display panel, the third display panel is adjacent to a second side of the fourth display panel, and the pad area of the fourth display panel may be in a third side of the fourth display panel facing the first side of the fourth display panel.

In embodiments, the pad area of the second display panel and the pad area of the fourth display panel may face each other.

In embodiments, the pad area of the first display panel and the pad area of the second display panel may extend in the row direction, and the pad area of the third display panel and the pad area of the fourth display panel may extend in the row direction.

In embodiments, the tiled display structure may further include a first outer periphery power supply wire extending from the pad area of the third display panel to the pad area of the first display panel and a second outer periphery power supply wire extending from the pad area of the fourth display panel to the pad area of the second display panel.

In embodiments, the first outer periphery power supply wire may be in a fourth side of the first display panel facing the first side of the first display panel and a fourth side of the third display panel facing the first side of the third display panel, and the second outer periphery power supply wire may be in a fourth side of the second display panel facing a second side of the second display panel and a fourth side of the fourth display panel facing a second side of the fourth display panel.

In embodiments, each of the pixels may include a first sub-pixel, second sub-pixels, and third sub-pixels. The first sub-pixel has a rectangular shape. The second sub-pixels may be adjacent to a first side of the first sub-pixel and a second side of the first sub-pixel facing the first side of the first sub-pixel, and may have a triangular shape. The third sub-pixels may be adjacent to a third side of the first sub-pixel and a fourth side of the first sub-pixel facing the third side of the first sub-pixel, and may have a triangular shape.

In embodiments, the tiled display structure may further include pad electrodes in the pad area of each of the first to fourth display panels.

In embodiments, the first to fourth display panels may be arranged in two rows and two columns.

Since one or more embodiment of the display device uses the first to fourth display panels having the same pixel structure, even when the third display panel is rotated by 180 degrees with respect to the first display panel, and the fourth display panel is rotated by 180 degrees with respect to the second display panel, the arrangement of the sub-pixels included in the pixels arranged in the second direction or the fourth direction may not be changed. Accordingly, the arrangement of the pixels adjacent to a boundary between the first display panel and the third display panel and the arrangement of the pixels adjacent to a boundary between the second display panel and the fourth display panel may not be changed, so that the unnaturalness may not be visually recognized by the user of the display device at a portion of the display device that is adjacent to the boundary.

In addition, the tiled display structure may be obtained by removing a part of the peripheral area at the portion where the first to fourth display panels are adjacent to each other, so that the width of the peripheral area may be relatively reduced in the portion where the first to fourth display panels are adjacent to each other. Accordingly, the unnaturalness may not be visually recognized even more by the user of the display device at the portion of the display device that is adjacent to the boundary.

According to embodiments of a method of manufacturing the display device, the tiled display structure is manufactured by using the first to fourth display panels having the same structure, so that the tiled display structure may be implemented without using other types of display panels. Accordingly, a manufacturing cost of the display device may be relatively reduced.

BRIEF DESCRIPTION OF THE DRAWINGS

Embodiments can be understood in more detail from the following description taken in conjunction with the accompanying drawings.

FIGS. 14 to 18 are views showing an embodiment of a method of manufacturing a display device.

DETAILED DESCRIPTION

Figure 1:
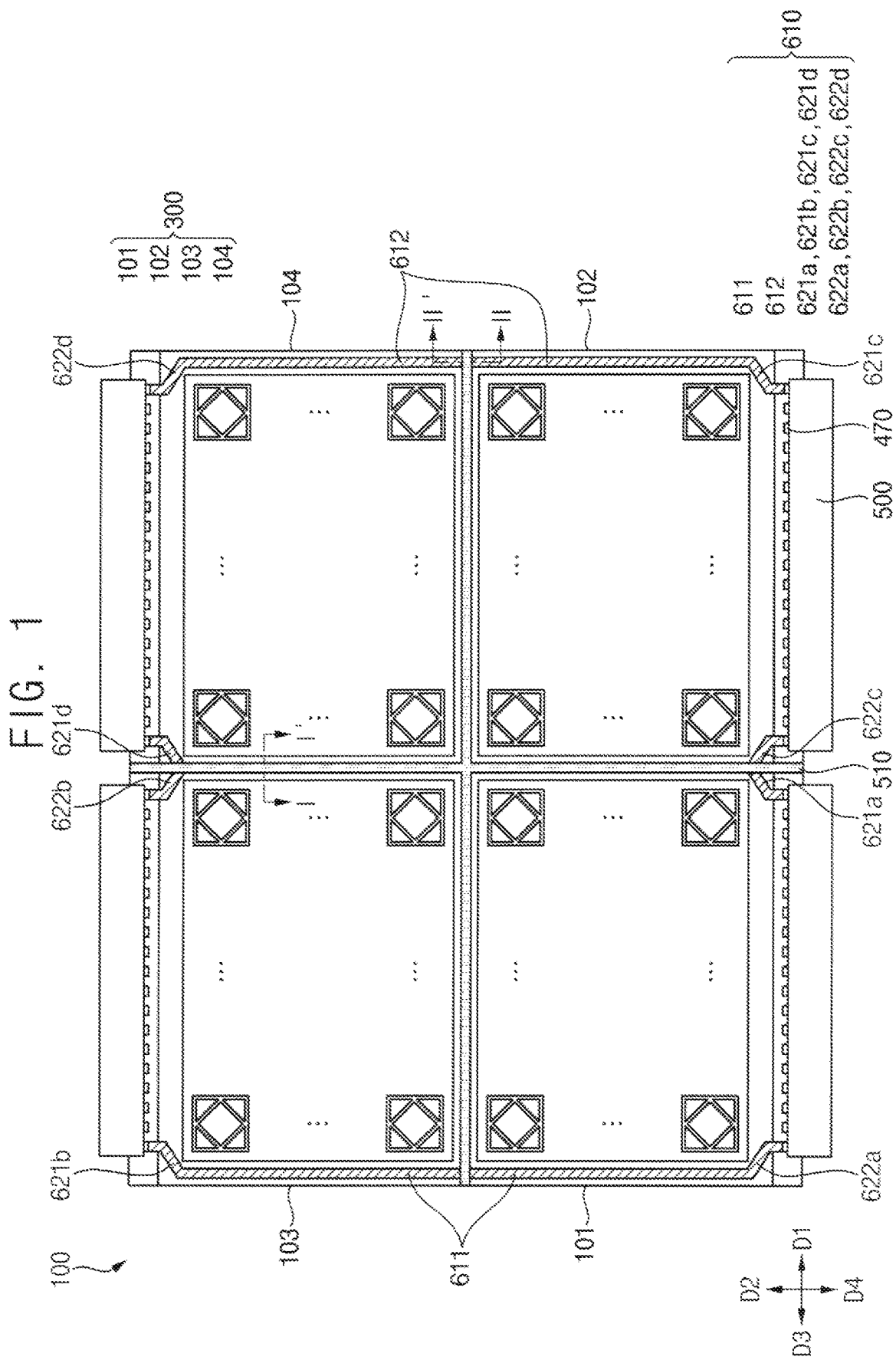
FIG. 1 is a plan view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of display devices and a method of manufacturing a display device 100 will be described in detail with reference to the accompanying drawings. In the accompanying drawings, same or similar reference numerals refer to the same or similar elements.

When a tiled display device is implemented with display panels, a portion of the display panels may be rotated by 180 degrees to change an arrangement of pixels adjacent to a boundary between these display panels and other display panels so that unnaturalness may be visually recognized at the boundary from outside the tiled display device such as by a user of the tiled display device.

Figure 2:
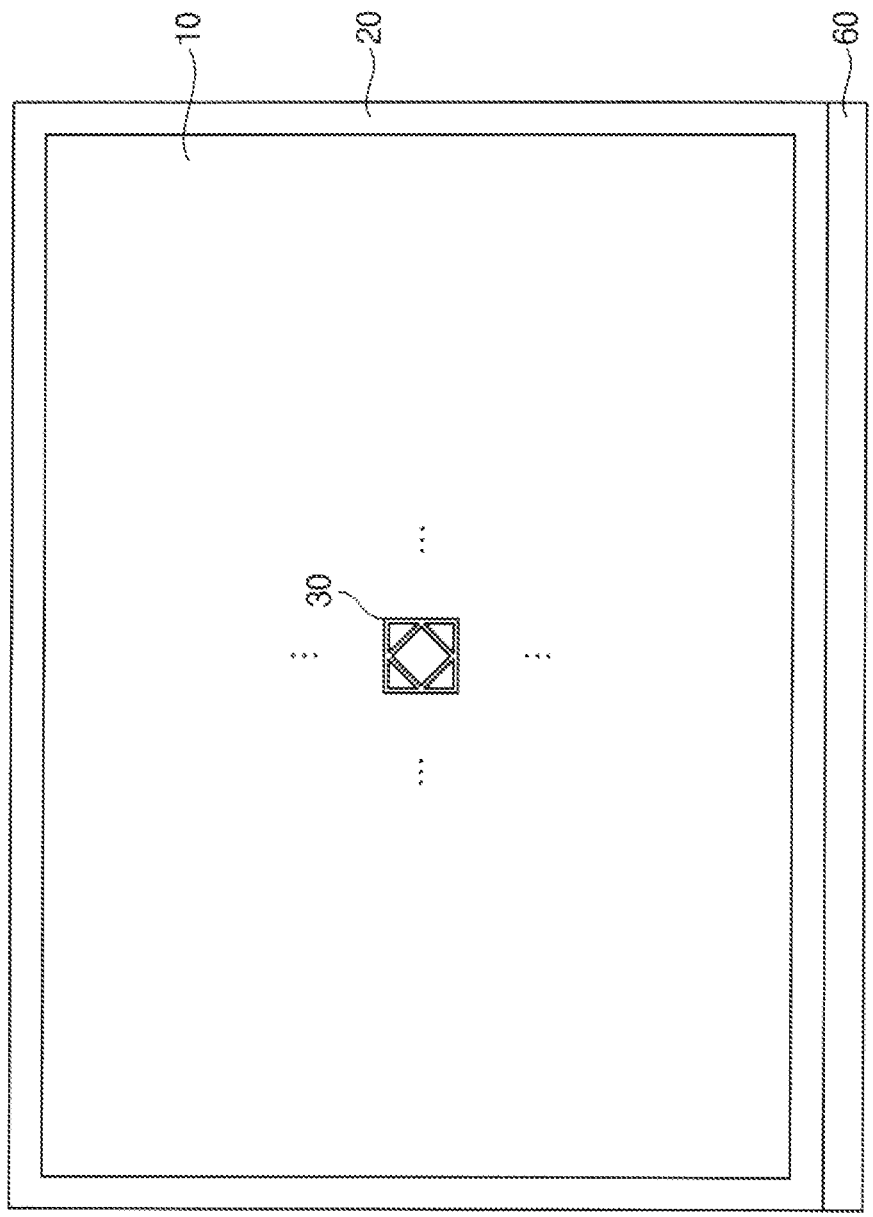
FIG. 2 is a plan view for describing an embodiment of areas included in the display device of FIG. 1.
Figure 3:
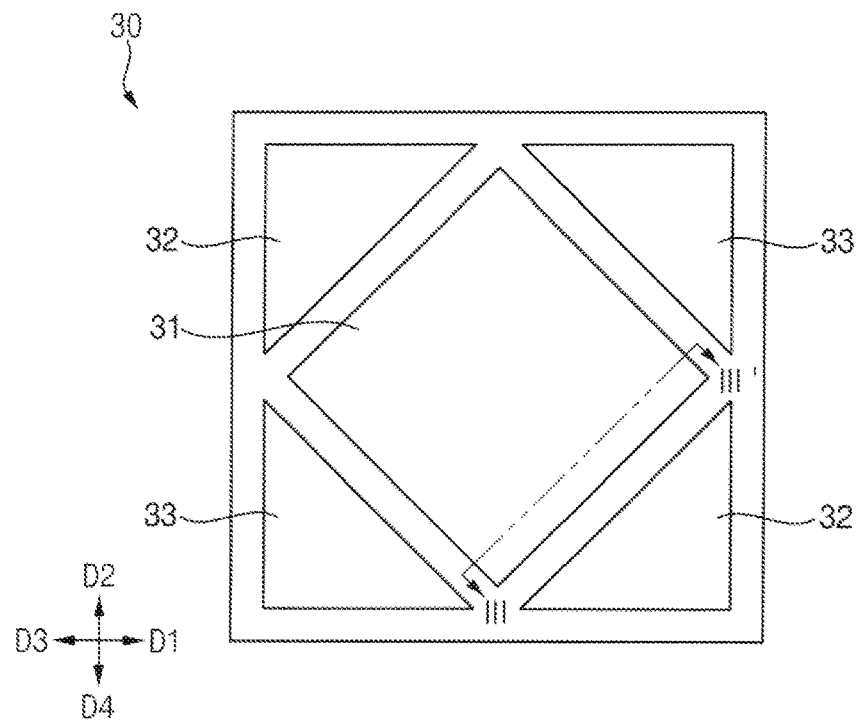
FIG. 3 is a plan view for describing an embodiment of an arrangement of sub-pixel areas included in a pixel area of FIG. 2.
Figure 4:
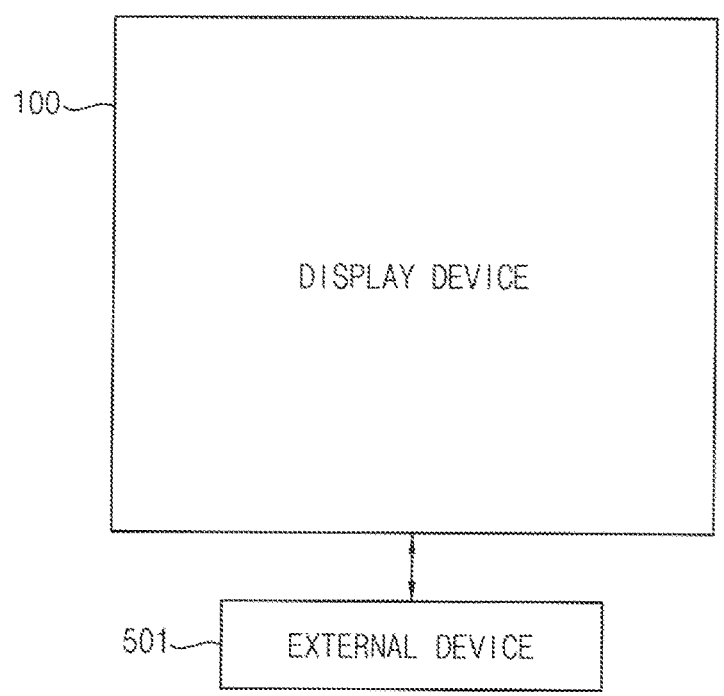
FIG. 4 is a block diagram showing an embodiment of an external device electrically connected to the display device of FIG. 1.

FIG. 1 is a plan view showing an embodiment of a display device 100, and FIG. 2 is a plan view for describing areas included in the display device 100 of FIG. 1. FIG. 3 is a plan view for describing an embodiment of an arrangement of sub-pixel areas included in a pixel area 30 of FIG. 2, and FIG. 4 is a block diagram showing an external device 501 electrically connected to the display device 100 of FIG. 1.

A display device 100 may include a tiled display structure 300 (e.g., tiled display device) and a conductive film layer 510. In this case, the tiled display structure 300 may include a first display panel 101, a second display panel 102, a third display panel 103, and a fourth display panel 104. As shown in FIGS. 2 and 3, each of the first to fourth display panels 101, 102, 103, and 104 may include a display area 10, a peripheral area 20, and a pad area 60. The display area 10 may include a pixel provided in plural including a plurality of pixels. Various elements and layers of the display device 100 may include a display area 10, a peripheral area 20 and a pad area 60 corresponding to those described above for the display device 100.

The display area 10 of a respective display panel may include a pixel area 30 provided in plural including a plurality of pixel areas 30. A pixel area 30 may correspond to a pixel of the display area 10, without being limited thereto. That is, the pixel may have a pixel structure which includes the pixel area 30. One pixel area 30 among the pixel areas 30 may include a plurality of sub-pixel areas including a first sub-pixel area 31, a second sub-pixel area 32 provided in plural including a plurality of second sub-pixel areas 32, and a third sub-pixel area 33 provided in plural including a plurality of third sub-pixel areas 33. A reference orientation of the pixel area 30 may include each of the first sub-pixel area 31, the second sub-pixel area 32 and the third sub-pixel area 33 arranged in locations within the pixel area 30.

The peripheral area 20 is adjacent to the display area 10. In an embodiment, for example, the peripheral area 20 may surround the display area 10, and the pad area 60 may be located at one side of the peripheral area 20. The peripheral area 20 and the pad area 60 may together define a non-display area of the display device 100, without being limited thereto or thereby.

Referring to FIGS. 1 and 2, a same structure of the display panels may define a reference orientation from which a display panel within the tiled display structure 300 may be rotated. The reference orientation may include the display area 10, the peripheral area 20 and the pad area 60 in order in a single direction.

The first and second display panels 101 and 102 may be adjacent to each other in or along a row direction so that the first display panel 101 and the second display panel 102 may be symmetrical with each other about the conductive film layer 510 located between the first display panel 101 and the second display panel 102 and extending in or along a column direction. In addition, the first and third display panels 101 and 103 may be adjacent to each other in or along the column direction while the third display panel 103 is rotated by 180 degrees from the reference orientation so that the first display panel 101 and the third display panel 103 may be symmetrical with each other about the conductive film layer 510 located between the first display panel 101 and the third display panel 103 and extending in or along the row direction. Moreover, the second and fourth display panels 102 and 104 may be adjacent to each other in or along the column direction while the fourth display panel 104 is rotated by 180 degrees from the reference orientation so that the second display panel 102 and the fourth display panel 104 may be symmetrical with each other about the conductive film layer 510 located between the second display panel 102 and the fourth display panel 104 and extending in or along the row direction. In other words, the first to fourth display panels 101, 102, 103, and 104 may be arranged in the form of a lattice having two rows and two columns.

In other words, the second display panel 102 may be adjacent to a first side of the first display panel 101, the third display panel 103 may be adjacent to a second side of the first display panel 101, and the fourth display panel 104 may be adjacent to a first side of the third display panel 103 and a first side of the second display panel 102. The display panels within the tiled display structure 300 define a plurality of display areas 10, a plurality of peripheral areas 20 and a plurality of pad areas 60.

However, although the tiled display structure 300 has been described as including four display panels, the configuration is not limited thereto. In an embodiment, for example, the tiled display structure 300 may include two display panels (e.g., configured in one row and two columns or in two rows and one column), six display panels (e.g., configured in two rows and three columns or in three rows and two columns), nine display panels (e.g., configured in three rows and three columns), and the like.

In the display areas 10 of the tiled display structure 300 (e.g., the display area 10 of each of the first to fourth display panels 101, 102, 103, and 104), the pixel areas 30 may be arranged in a first direction D1 that is parallel to a top surface of the display device 100 and a second direction D2 intersecting the first direction D1. A plane of the tiled display structure 300 may be defined by the first direction D1 and the second direction D2 crossing each other. A thickness of the tiled display structure 300 and various elements and layers thereof may be taken along a thickness direction crossing the plane described above.

In the display areas 10 of the tiled display structure 300, the pixel areas 30 may be spaced apart from each other, and the first to third sub-pixel areas 31, 32, and 33 included in each of the pixel areas 30 may be repeatedly arranged in the row direction (e.g., the first direction D1 or a third direction D3 that is opposite to the first direction D1) and the column direction (e.g., the second direction D2 or a fourth direction D4 that is opposite to the second direction D2) along a plane of the tiled display structure 300.

For example, as shown in FIG. 3, the first sub-pixel area 31 may have a rectilinear shape such as a rectangular shape when viewed in a plan view. The first sub-pixel area 31 may correspond to a first color. In embodiments, the first sub-pixel area 31 may have a square shape when viewed in a plan view. The second sub-pixel areas 32 may be adjacent to a first side of the first sub-pixel area 31 and a second side of the first sub-pixel area 31 which faces the first side of the first sub-pixel area 31, and may have a triangular shape when viewed in a plan view. The second sub-pixel area 32 may correspond to a second color different from the first color. The third sub-pixel areas 33 may be adjacent to a third side of the first sub-pixel area 31 and a fourth side of the first sub-pixel area 31 which faces the third side of the first sub-pixel area 31, and may have a triangular shape when viewed in a plan view. The third sub-pixel area 33 may correspond to a third color different from the first color and the second color. In the embodiments, even when each of the first to fourth display panels 101, 102, 103, and 104 including the pixel areas 30 having the arrangement of the first to third sub-pixel areas 31, 32, and 33 shown in FIG. 3 is rotated, the arrangement may be the same in the second direction D2 or the fourth direction D4. In an embodiment, two sub-pixels (e.g., the second sub-pixel area 32 and the third sub-pixel area 33) of each pixel within a respective display panel in a reference orientation are in a same location of the each pixel within the respective display panel rotated 180 degrees from the reference orientation.

Figure 7:
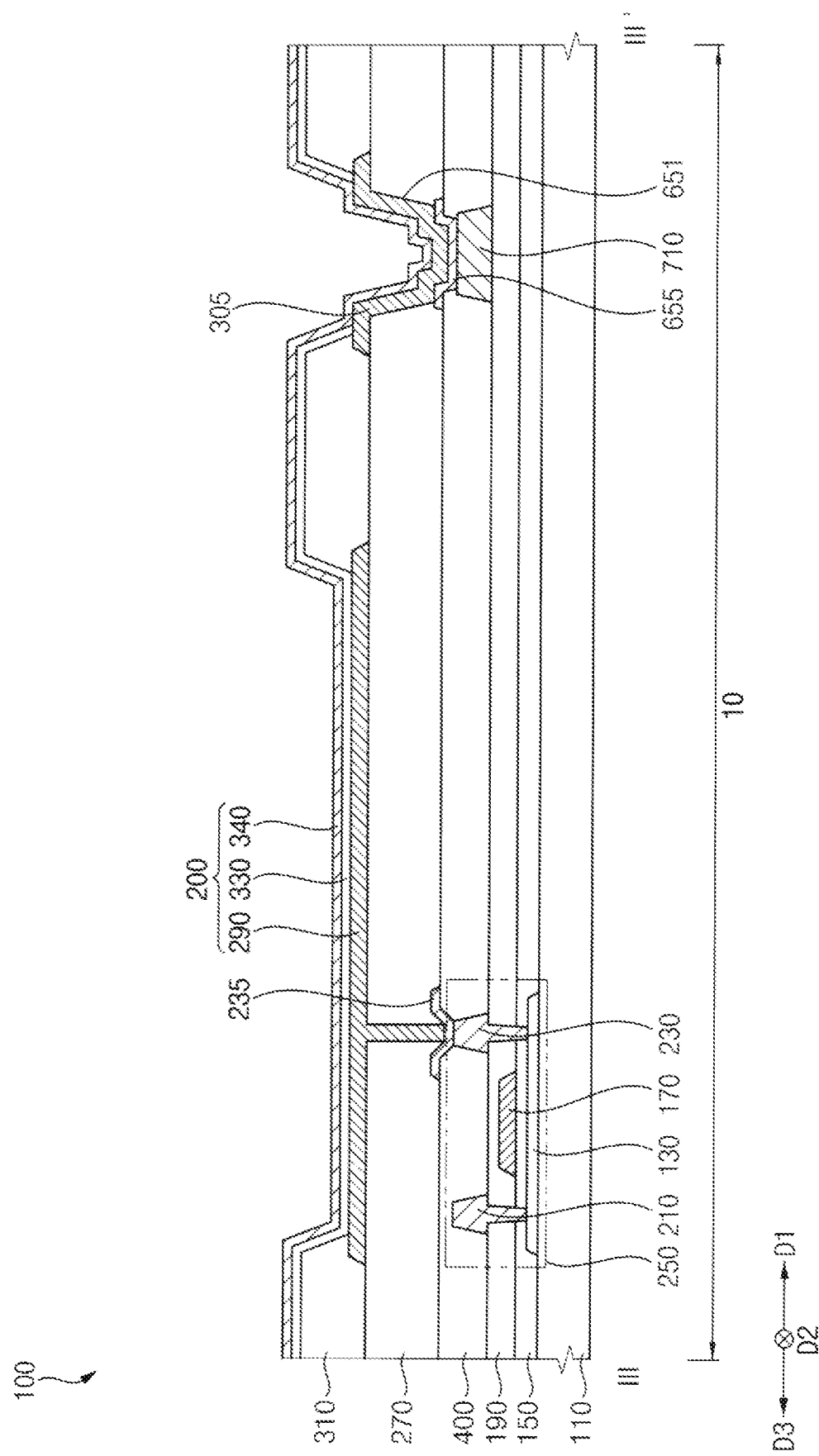
FIG. 7 is a cross-sectional view taken along line of the display device of FIG. 3.

The tiled display structure 300 (e.g., each of the first to fourth display panels 101, 102, 103, and 104) may further include first to third sub-pixels (e.g., a sub-pixel structure 200 of FIG. 7). In this case, the pixels included in each of the first to fourth display panels 101, 102, 103, and 104 may have the same structure. The first to third sub-pixels may be disposed in or correspond to the first to third sub-pixel areas 31, 32, and 33, respectively. That is, each of the pixels within a respective display panel may include a plurality of sub-pixels including a first sub-pixel, second sub-pixels, and third sub-pixels respectively corresponding to the first sub-pixel area 31, the second sub-pixel areas 32 and the third sub-pixel areas 33.

In an embodiment, planar shapes of the first to third sub-pixel areas 31, 32, and 33 may be the same as planar shapes of the first to third sub-pixels, respectively. In an embodiment, for example, the first sub-pixel disposed in the first sub-pixel area 31 may emit a green light, the second sub-pixel disposed in the second sub-pixel areas 32 may emit a red light, and the third sub-pixel disposed in the third sub-pixel areas 33 may emit a blue light. The display device 100 may display an image along the plane of the tiled display structure 300 through the first to third sub-pixels. In other embodiments, a sub-pixel configured to emit a red or blue light may be disposed in the first sub-pixel area 31, a sub-pixel configured to emit a green or blue light may be disposed in the second sub-pixel areas 32, and a sub-pixel configured to emit a red or green light may be disposed in the third sub-pixel areas 33.

The pad area 60 may be adjacent to one side of the display area 10 of each of the first to fourth display panels 101, 102, 103, and 104. In an embodiment, for example, the pad area 60 may be located at a third side of the first display panel 101 facing or opposing the second side of the first display panel 101. The first display panel 101 may be adjacent to or closest to a second side of the third display panel 103, and the pad area 60 may be located at a third side of the third display panel 103 facing or opposing the second side of the third display panel 103. In this case, the pad area 60 of the first display panel 101 and the pad area 60 of the third display panel 103 may face or be opposite to each other. In addition, the first display panel 101 may be adjacent to a second side of the second display panel 102, and the pad area 60 may be located at a third side of the second display panel 102 facing or opposing the first side of the second display panel 102;

and the second display panel 102 may be adjacent to a first side of the fourth display panel 104, the third display panel 103 may be adjacent to a second side of the fourth display panel 104, and the pad area 60 may be located at a third side of the fourth display panel 104 facing or opposing the first side of the fourth display panel 104. In this case, the pad area 60 of the second display panel 102 and the pad area 60 of the fourth display panel 104 may face or be opposite to each other. Accordingly, the pad area 60 of the first display panel 101 and the pad area 60 of the second display panel 102 may extend along the row direction, and the pad area 60 of the third display panel 103 and the pad area 60 of the fourth display panel 104 may extend along the row direction.

The tiled display structure 300 may further include a pad electrode 470 provided in plural including a plurality of pad electrodes 470 and a printed circuit board 500 provided in plural including a plurality of printed circuit boards 500. The pad electrode 470 may be disposed in the pad area 60 of each of the first to fourth display panels 101, 102, 103, and 104. The pad electrode 470 of the display panels may be electrically connected to the first to third sub-pixels disposed in the display area 10.

The printed circuit board 500 may be disposed on or corresponding to the pad electrodes 470. In an embodiment, for example, an anisotropic conductive film ("ACF") and a flexible printed circuit board ("FPCB") may be further provided on the pad electrode 470, and the pad electrode 470 and the printed circuit board 500 may be electrically connected to each other through the ACF and the FPCB. A printed circuit board 500 which is external to a respective display panel may be connected to the respective display panel at the pad electrode 470 thereof.

An external device 501 may generate an electrical signal such as a data signal, a gate signal, a power supply voltage, and the like. The data signal, the gate signal, the power supply voltage, and the like may be provided to the printed circuit board 500, and the data signal, the gate signal, the power supply voltage, and the like may be provided to the display device 100 from the printed circuit board 500. In other words, as shown in FIG. 4, the display device 100 may be electrically connected to the external device 501.

The pad electrode 470 may include a metal, an alloy, metal nitride, conductive metal oxide, a transparent conductive material, and the like. These may be used alone or in combination with each other. In other embodiments, the pad electrode 470 may have a multilayer structure including a plurality of metal layers. In an embodiment, for example, the metal layers may have mutually different thicknesses, or may include mutually different materials.

Referring again to FIGS. 1 to 4, the tiled display structure 300 may further include an outer periphery power supply wire 610 disposed at an outermost periphery of a collection of the first to fourth display panels 101, 102, 103, and 104. In other words, the outer periphery power supply wire 610 may be disposed in a part of the pad area 60 and the peripheral area 20 of each of the first to fourth display panels 101, 102, 103, and 104. In this case, the outer periphery power supply wire 610 may include first input parts 621a, 621b, 621c, and 621d, a second input part collectively including a plurality of second input parts 622a, 622b, 622c, and 622d, a first outer periphery power supply wire 611, and a second outer periphery power supply wire 612. The outer periphery power supply wire 610 may receive the power supply voltage from the external device 501, or may be grounded. When the power supply voltage is provided to the outer periphery power supply wire 610, the power supply voltage may be applied to the pixels of respective display panels. In addition, when the outer periphery power supply wire 610 is grounded, the outer periphery power supply wire 610 may be used to reduce or effectively prevent damage caused by static electricity introduced from outside the tiled display structure 300.

The first outer periphery power supply wire 611 may extend through the peripheral area 20 of the third display panel 103 and the peripheral area 20 of the first display panel 101 in a direction from the pad area 60 of the third display panel 103 to the pad area 60 of the first display panel 101. In this case, the first input part 621b disposed on the third display panel 103 and the second input part 622a disposed on the first display panel 101 may be connected to the first outer periphery power supply wire 611, and the first outer periphery power supply wire 611 may make contact with the conductive film layer 510 at a boundary between the third display panel 103 and the first display panel 101 (e.g., first boundary). In addition, the second input part 622b disposed on the third display panel 103 and the first input part 621a disposed on the first display panel 101 may make contact with the conductive film layer 510 respectively at a boundary between the first display panel 101 and the second display panel 102 (e.g., third boundary) and a boundary between the third display panel 103 and the fourth display panel 104 (e.g., fourth boundary).

The second outer periphery power supply wire 612 may extend through the peripheral area 20 of the fourth display panel 104 and the peripheral area 20 of the second display panel 102 in a direction from the pad area 60 of the fourth display panel 104 to the pad area 60 of the second display panel 102. In this case, the second input part 622d disposed on the fourth display panel 104 and the first input part 621c disposed on the second display panel 102 may be connected to the second outer periphery power supply wire 612, and the second outer periphery power supply wire 612 may make contact with the conductive film layer 510 at a boundary between the fourth display panel 104 and the second display panel 102 (e.g., second boundary). In addition, the first input part 621d disposed on the fourth display panel 104 and the second input part 622c disposed on the second display panel 102 may make contact with the conductive film layer 510. In other words, the first outer periphery power supply wire 611 may be disposed at a fourth side of the first display panel 101 facing the first side of the first display panel 101 and a fourth side of the third display panel 103 facing the first side of the third display panel 103, and the second outer periphery power supply wire 612 may be disposed in a fourth side of the second display panel 102 facing the second side of the second display panel 102 and a fourth side of the fourth display panel 104 facing the second side of the fourth display panel 104.

In a conventional display device, an interval between a first display panel 101 and a third display panel 103, an interval between the first display panel 101 and a second display panel 102, an interval between the third display panel 103 and a fourth display panel 104, and an interval between the fourth display panel 104 and the second display panel 102 may be relatively wide. In other words, each of the first to fourth display panels 101, 102, 103, and 104 may include a peripheral area 20, and when a conventional tiled display structure is prepared by using the first to fourth display panels 101, 102, 103, and 104, unnaturalness may be visually recognized from outside the conventional tiled display structure such as by a user thereof due to the peripheral areas 20 adjacent to each other at an interval between respective display panels.

Figure 15:
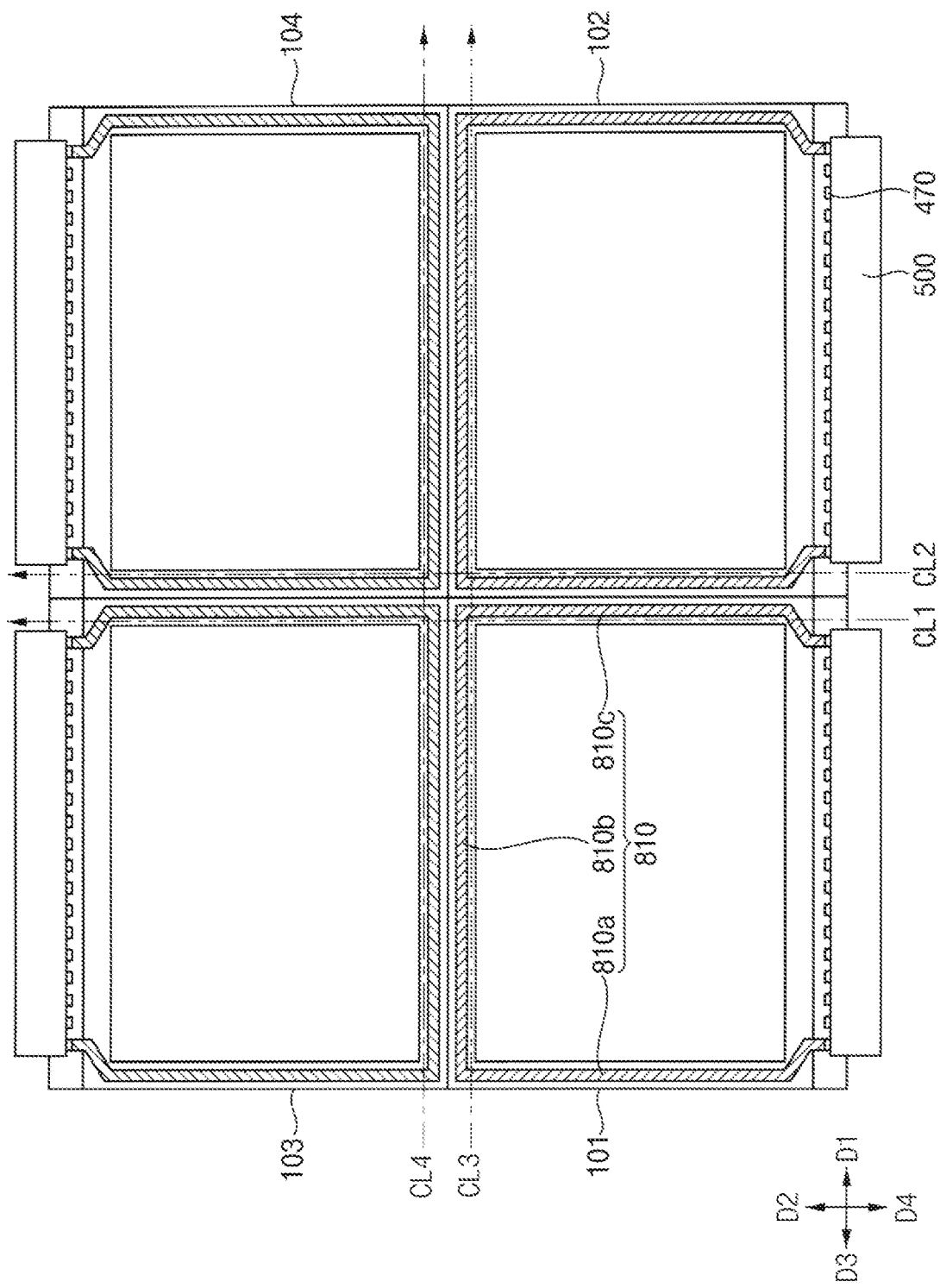

In the embodiments, the tiled display structure 300 may be obtained by removing or omitting a part of the peripheral area 20 at facing sides where the first to fourth display panels 101, 102, 103, and 104 are adjacent to each other (e.g., see FIG. 15). Accordingly, a width of the peripheral area 20 may be relatively reduced in the portion of a respective display panel where the first to fourth display panels 101, 102, 103, and 104 are adjacent to each other. In addition, although there may be a concern about a decrease in an electrical resistance of the tiled display structure 300 because a part of the outer periphery power supply wire 610 is disposed in the removed portion of the peripheral area 20, since the first to fourth display panels 101, 102, 103, and 104 additionally conduct electricity through the conductive film layer 510, the electrical resistance of the tiled display structure 300 may not be decreased. In this case, since a total area of a conductive wire is relatively increased by the conductive film layer 510 in addition to the outer periphery power supply wire 610, an electrical capacitance may be increased, so that it may be more advantageous to prevent damage caused by static electricity introduced from outside the tiled display structure 300.

The conductive film layer 510 may be disposed between the first display panel 101 and each of the second and third display panels 102 and 103, respectively, and between the fourth display panel 104 and each of the second and third display panels 102 and 103, respectively. In an embodiment, for example, when viewed in a plan view of the display device 100, the conductive film layer 510 may have a cross shape. In an embodiment, for example, the first display panel 101 and the third display panel 103 may be symmetrical with each other about a portion of the conductive film layer 510 located between the first and third display panels 101 and 103, and the second display panel 102 and the fourth display panel 104 may be symmetrical with each other about a portion of the conductive film layer 510 located between the second and fourth display panels 102 and 104. In addition, the first display panel 101 and the second display panel 102 may be symmetrical with each other about a portion of the conductive film layer 510 located between the first and second display panels 101 and 102, and the third and fourth display panels 103 and 104 may be symmetrical with each other about a portion of the conductive film layer 510 located between the third and fourth display panels 103 and 104. The first to fourth display panels 101, 102, 103, and 104 may be connected to each other through the conductive film layer 510. In other words, the first to fourth display panels 101, 102, 103, and 104 may be adhered to each other through the conductive film layer 510.

The conductive film layer 510 may include a film layer and a conductive element such as conductive balls which are disposed inside the film layer. The outer periphery power supply wire 610 disposed on each of the first to fourth display panels 101, 102, 103, and 104 may conduct electricity through the conductive balls. The film layer may include a thermosetting resin or a photocurable resin. In an embodiment, for example, the film layer may include an epoxy resin, an amino resin, a phenol resin, a urea resin, a melamine resin, an unsaturated polyester resin, a polyurethane resin, a polyimide resin, and the like. In addition, each of the conductive balls may have a structure in which a spherical polymer is coated with a metal layer such as nickel, cobalt, gold, silver, or copper.

Accordingly, the display device 100 including the tiled display structure 300 and the conductive film layer 510 may be provided.

Since embodiments of the display device 100 use the first to fourth display panels 101, 102, 103, and 104 having the same pixel structure, even when the third display panel 103 is rotated by 180 degrees with respect to the first display panel 101 and the fourth display panel 104 is rotated by 180 degrees with respect to the second display panel 102, the arrangement of the sub-pixels included in the pixels arranged in the second direction D2 or the fourth direction D4 may not be changed. Accordingly, the arrangement of the pixels adjacent to a boundary between the first display panel 101 and the third display panel 103 and the arrangement of the pixels adjacent to a boundary between the second display panel 102 and the fourth display panel 104 may not be changed, so that the unnaturalness may not be visually recognized from outside the display device 100 such as by the user of the display device 100 at the respectively boundaries.

In addition, the tiled display structure 300 may be obtained by removing or excluding an original part of the peripheral area 20 at the portion where the first to fourth display panels 101, 102, 103, and 104 are adjacent to each other, so that a total width of the peripheral area 20 may be relatively reduced at the portion where the first to fourth display panels 101, 102, 103, and 104 are adjacent to each other. Accordingly, visibility from outside the display device 100 of the unnaturalness at the boundary may be further reduced or effectively prevented.

Figure 5:
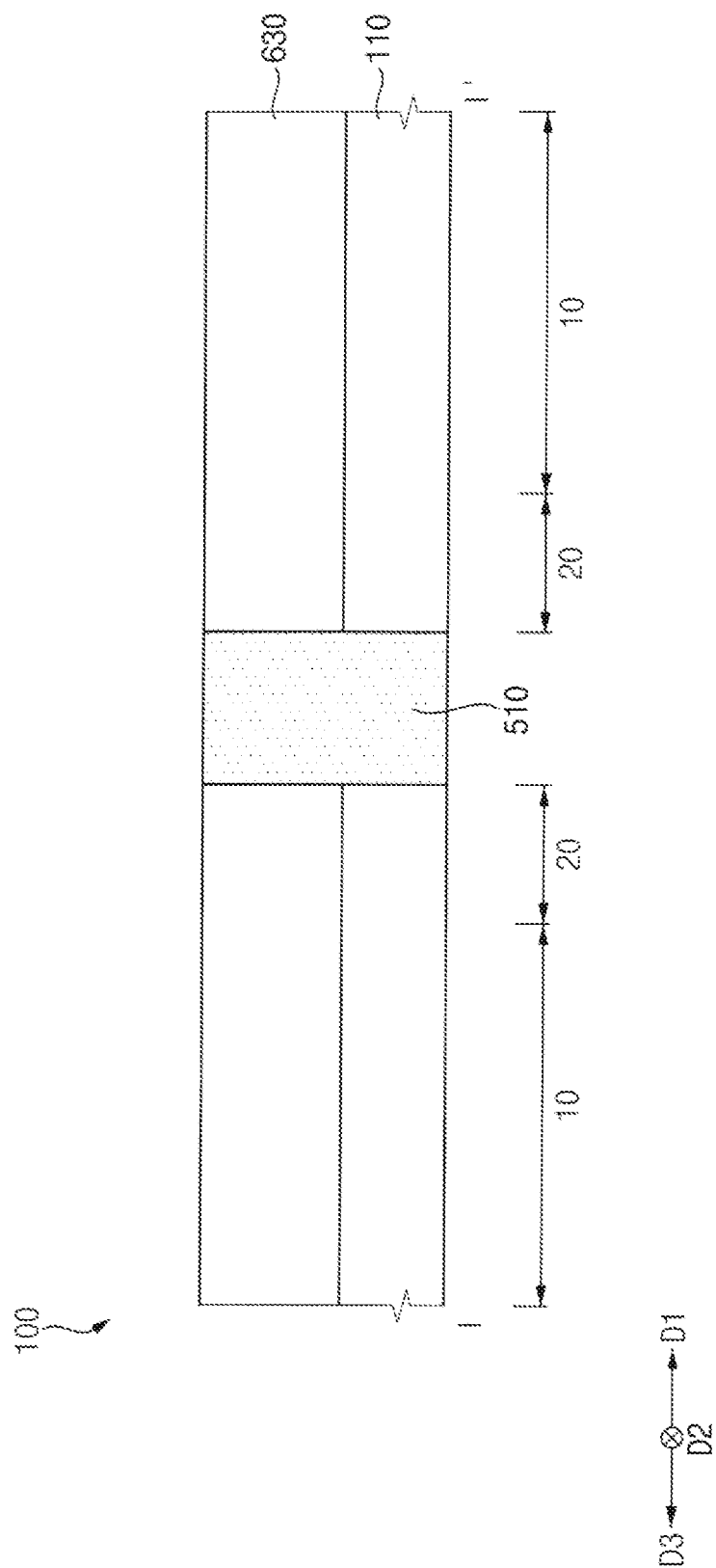
FIG. 5 is a cross-sectional view taken along line I-I' of the display device of FIG. 1.
Figure 6:
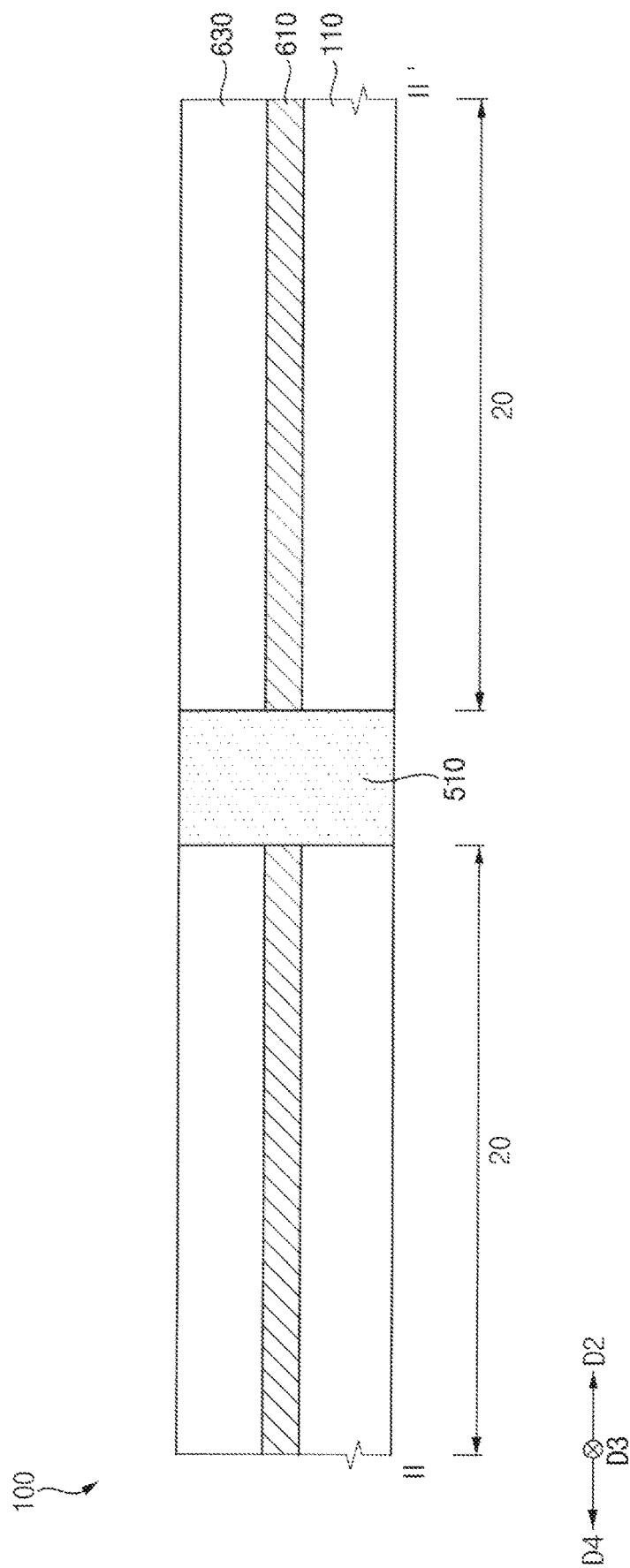
FIG. 6 is a cross-sectional view taken along line II-IF of the display device of FIG. 1.

FIG. 5 is a cross-sectional view taken along line I-I' of the display device 100 of FIG. 1, and FIG. 6 is a cross-sectional view taken along line II-II' of the display device 100 of FIG. 1. FIG. 7 is a cross-sectional view taken along line III-III' of the display device 100 of FIG. 3.

Referring to FIGS. 5, 6, and 7, the display device 100 may further include a substrate 110, a semiconductor element 250, a protective insulating layer 400, an inner power supply wire 710, a first connection pattern 235, a second connection pattern 655, a sub-pixel structure 200, an electrode pattern 305, a pixel defining layer 310, and the like. In this case, the semiconductor element 250 may include an active layer 130, a gate insulating layer 150, a gate electrode 170, an interlayer insulating layer 190, a source electrode 210, and a drain electrode 230, and the sub-pixel structure 200 may include a lower electrode 290, a light emitting layer 330, and an upper electrode 340. The sub-pixel structure 200 may define a light emitting element, without being limited thereto. The semiconductor element 250 may be connected to the sub-pixel structure 200 to drive and/or control the sub-pixel structure 200 to emit light, display an image, etc.

The substrate 110 including transparent or opaque materials may be provided. The substrate 110 may include a quartz substrate, a synthetic quartz substrate, a calcium fluoride substrate, a fluorine-doped quartz substrate (F-doped quartz substrate), a soda lime glass substrate, a non-alkali glass substrate, and the like. In some embodiments, the substrate 110 may be a transparent resin substrate having flexibility. In this case, the substrate 110 may have a configuration in which a first organic layer, a first barrier layer, a second organic layer, and a second barrier layer are sequentially stacked. The first barrier layer and the second barrier layer may include an inorganic insulating material such as silicon oxide, and may block water and/or moisture penetrating through the first and second organic layers. In addition, the first organic layer and the second organic layer may include an organic insulating material having flexibility such as a polyimide-based resin.

A buffer layer may be disposed on the substrate 110. The buffer layer may be disposed over the whole of the display area 10, the peripheral area 20, and the pad area 60 on the substrate 110. In an embodiment, for example, the buffer layer may reduce or effectively prevent metal atoms or impurities from diffusing from the substrate 110 to the semiconductor element 250, and may control a heat transfer rate during a crystallization process for forming the active layer 130 to obtain a substantially uniform active layer 130. In addition, when a surface of the substrate 110 is not uniform, the buffer layer may serve to improve flatness of the surface of the substrate 110. Depending on a type of the substrate 110, at least two buffer layers may be provided on the substrate 110, or the buffer layer may not be provided. The buffer layer may include a silicon compound, metal oxide, and the like.

The active layer 130 may be disposed in the pixel area 30 on the substrate 110. The active layer 130 may include a metal oxide semiconductor, an inorganic semiconductor (e.g., amorphous silicon or poly silicon), an organic semiconductor, or the like. The active layer 130 may include a source region, a drain region, and a channel region located between the source region and the drain region.

The gate insulating layer 150 may be disposed on the active layer 130. The gate insulating layer 150 may be disposed in the display area 10, the peripheral area 20, and the pad area 60 on the substrate 110. In an embodiment, for example, the gate insulating layer 150 may cover the active layer 130 on the substrate 110, and may have a substantially flat top surface without creating a step around the active layer 130. In some embodiments, the gate insulating layer 150 may be disposed along a profile of the active layer 130 with a uniform thickness to cover the active layer 130 on the substrate 110. The gate insulating layer 150 may include a silicon compound, metal oxide, and the like. In an embodiment, for example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In other embodiments, the gate insulating layer 150 may have a multilayer structure including a plurality of insulating layers. In an embodiment, for example, the insulating layers may have mutually different thicknesses, or may include mutually different materials.

The gate electrode 170 may be disposed in the pixel area 30 on the gate insulating layer 150. The gate electrode 170 may be disposed on a portion of the gate insulating layer 150 under which the active layer 130 is located (e.g., to overlap the channel region of the active layer 130). The gate electrode 170 may include a metal, an alloy, metal nitride, conductive metal oxide, a transparent conductive material, and the like. These may be used alone or in combination with each other. In other embodiments, the gate electrode 170 may have a multilayer structure including a plurality of metal layers. In an embodiment, for example, the metal layers may have mutually different thicknesses, or may include mutually different materials.

The interlayer insulating layer 190 may be disposed on the gate electrode 170. The interlayer insulating layer 190 may be disposed in the display area 10, the peripheral area 20, and the pad area 60 on the gate insulating layer 150. In an embodiment, for example, the interlayer insulating layer 190 may cover the gate electrode 170 on the gate insulating layer 150, and may have a substantially flat top surface without creating a step around the gate electrode 170. In some embodiments, the interlayer insulating layer 190 may be disposed along a profile of the gate electrode 170 with a uniform thickness to cover the gate electrode 170 on the gate insulating layer 150. The interlayer insulating layer 190 may include a silicon compound, metal oxide, and the like. In other embodiments, the interlayer insulating layer 190 may have a multilayer structure including a plurality of insulating layers. In an embodiment, for example, the insulating layers may have mutually different thicknesses, or may include mutually different materials.

The source electrode 210 and the drain electrode 230 may be disposed in the pixel area 30 on the interlayer insulating layer 190. The source electrode 210 may be connected to the source region of the active layer 130 through a contact hole formed or provided by removing first portions of the gate insulating layer 150 and the interlayer insulating layer 190, and the drain electrode 230 may be connected to the drain region of the active layer 130 through a contact hole formed or provided by removing second portions of the gate insulating layer 150 and the interlayer insulating layer 190. Each of the source electrode 210 and the drain electrode 230 may include a metal, an alloy, metal nitride, conductive metal oxide, a transparent conductive material, and the like. These may be used alone or in combination with each other. In other embodiments, each of the source electrode 210 and the drain electrode 230 may have a multilayer structure including a plurality of metal layers. In an embodiment, for example, the metal layers may have mutually different thicknesses, or may include mutually different materials.

Accordingly, the semiconductor element 250 including the active layer 130, the gate insulating layer 150, the gate electrode 170, the interlayer insulating layer 190, the source electrode 210, and the drain electrode 230 may be provided.

Although the semiconductor element 250 has been described as having a top gate structure, the configuration is not limited thereto. In an embodiment, for example, the semiconductor element 250 may have a bottom gate structure.

In addition, although the display device 100 has been described as including one of the semiconductor element 250, the configuration is not limited thereto. In an embodiment, for example, the display device 100 may include at least one of the semiconductor element 250 and at least one storage capacitor.

Figure 13:
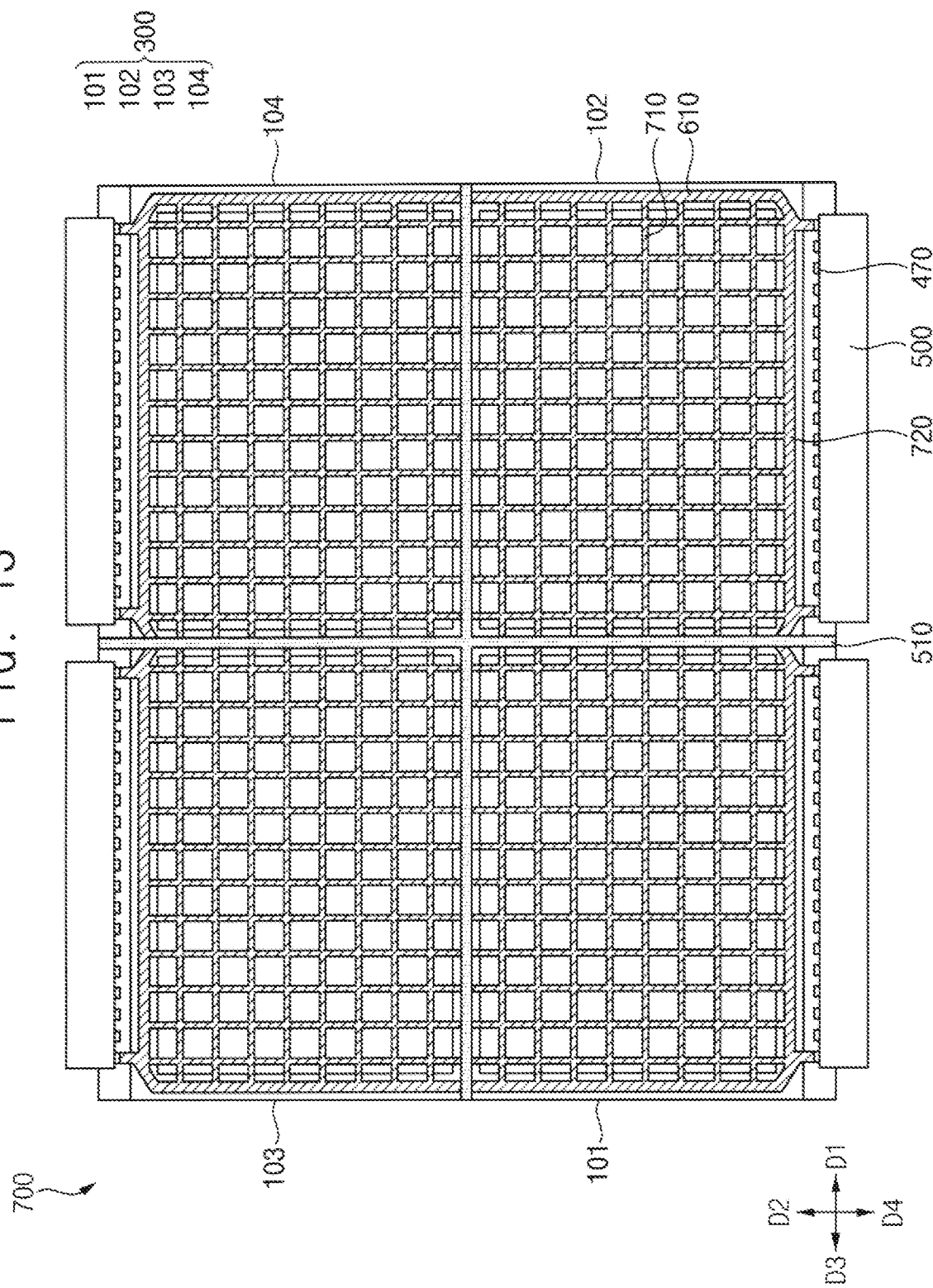
FIG. 13 is a plan view showing an embodiment of a display device.

The inner power supply wire 710 may be disposed in a lattice shape in the display area 10 on the interlayer insulating layer 190 (e.g., see an inner power supply wire 710 of FIG. 13). The inner power supply wire 710 may be electrically connected to the outer periphery power supply wire 610. The power supply voltage may be applied to the inner power supply wire 710, the inner power supply wire 710 may be electrically connected to the upper electrode 340 through a power supply contact hole 651, and the power supply voltage may be provided to the upper electrode 340.

As shown in FIG. 6, the outer periphery power supply wire 610 may be disposed in the peripheral area 20 on the substrate 110.

In an embodiment, for example, the outer periphery power supply wire 610 disposed on a right side of FIG. 6 may correspond to an outer periphery power supply wire 610 disposed on the fourth display panel 104, and the outer periphery power supply wire 610 disposed on a left side of FIG. 6 may correspond to an outer periphery power supply wire 610 disposed on the second display panel 102. The outer periphery power supply wire 610 may include a metal, an alloy, metal nitride, conductive metal oxide, a transparent conductive material, and the like. In an embodiment, for example, the outer periphery power supply wire 610 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In other embodiments, the outer periphery power supply wire 610 may have a multilayer structure including a plurality of metal layers. In an embodiment, for example, the metal layers may have mutually different thicknesses, or may include mutually different materials. In the embodiments, the source electrode 210, the drain electrode 230, the inner power supply wire 710, and the outer periphery power supply wire 610 may be simultaneously formed on the same layer by using the same material. As being formed on the same layer, elements may be respective portions of a same material layer on the substrate 110. That is, the source electrode 210, the drain electrode 230, the inner power supply wire 710, and the outer periphery power supply wire 610 may be in a same layer of the display device 100 as being respective patterns of a same conductive material layer on the substrate 110.

The protective insulating layer 400 may be disposed in the display area 10, the peripheral area 20, and the pad area 60 on the source and drain electrodes 210 and 230 and the inner power supply wire 710. In the embodiments, the protective insulating layer 400 may include or define a contact hole that exposes a part of a top surface of the drain electrode 230 to outside the protective insulating layer 400, a contact hole that exposes a part of a top surface of the inner power supply wire 710 to outside the protective insulating layer 400, and the like.

The protective insulating layer 400 may cover the source and drain electrodes 210 and 230 and the inner power supply wire 710 on the interlayer insulating layer 190, and may have a substantially flat top surface without creating a step around the source and drain electrodes 210 and 230 and the inner power supply wire 710. In some embodiments, the protective insulating layer 400 may be disposed along a profile of the source and drain electrodes 210 and 230 and the inner power supply wire 710 with a uniform thickness to cover the source and drain electrodes 210 and 230 and the inner power supply wire 710 on the interlayer insulating layer 190 and form a step corresponding to the profiles of the underlying elements. The protective insulating layer 400 may include a silicon compound, metal oxide, and the like. In other embodiments, the protective insulating layer 400 may have a multilayer structure including a plurality of insulating layers. In an embodiment, for example, the insulating layers may have mutually different thicknesses, or may include mutually different materials.

The first connection pattern 235 may be disposed in the contact hole that exposes a part of the top surface of the drain electrode 230 to outside the protective insulating layer 400, and the second connection pattern 655 may be disposed in the contact hole that exposes a part of the top surface of the inner power supply wire 710 to outside the protective insulating layer 400. In other words, at least a part of each of the first and second connection patterns 235 and 655 may be interposed between the protective insulating layer 400 and a planarization layer 270. The first connection pattern 235 may completely cover the drain electrode 230 exposed by the contact hole, and the second connection pattern 655 may completely cover the inner power supply wire 710 exposed by the contact hole. Each of the first and second connection patterns 235 and 655 may include a metal, an alloy, metal nitride, conductive metal oxide, a transparent conductive material, and the like. These may be used alone or in combination with each other. In other embodiments, each of the first and second connection patterns 235 and 655 may have a multilayer structure including a plurality of metal layers. In an embodiment, for example, the metal layers may have mutually different thicknesses, or may include mutually different materials.

The planarization layer 270 may be disposed on the first and second connection patterns 235 and 655. The planarization layer 270 may be disposed in the display area 10, the peripheral area 20, and the pad area 60 on the protective insulating layer 400. The planarization layer 270 may have or define a contact hole overlapping or aligned with the contact hole of the protective insulating layer 400 that exposes a part of the top surface of the inner power supply wire 710, and the contact hole may be defined as the power supply contact hole 651. The planarization layer 270 may have or define a contact hole overlapping or aligned with the contact hole of the protective insulating layer 400 that exposes a part of the top surface of the drain electrode 230, and the lower electrode 290 may be electrically connected to the semiconductor element 250 through the contact hole.

In an embodiment, for example, the planarization layer 270 may have a relatively large thickness. In this case, the planarization layer 270 may have a substantially flat top surface. In order to implement such a flat top surface of the planarization layer 270, a planarization process may be additionally performed on the planarization layer 270. In some embodiments, the planarization layer 270 may be disposed along a profile of the first and second connection patterns 235 and 655 with a uniform thickness on the protective insulating layer 400. The planarization layer 270 may be formed of an organic insulating material or an inorganic insulating material. In the embodiments, the planarization layer 270 may include an organic insulating material. For example, the planarization layer 270 may include a photoresist, a polyacryl-based resin, a polyimide-based resin, a polyamide-based resin, a siloxane-based resin, an acryl-based resin, an epoxy-based resin, and the like.

The lower electrode 290 may be disposed in the pixel area 30 on the planarization layer 270. The lower electrode 290 may include a metal, an alloy, metal nitride, conductive metal oxide, a transparent conductive material, and the like. These may be used alone or in combination with each other. In other embodiments, the lower electrode 290 may have a multilayer structure including a plurality of metal layers. For example, the metal layers may have mutually different thicknesses, or may include mutually different materials.

The electrode pattern 305 may be disposed in the power supply contact hole 651. The electrode pattern 305 may be disposed between the upper electrode 340 and the second connection pattern 655, and may completely cover the second connection pattern 655 exposed by the power supply contact hole 651. The electrode pattern 305 may include a metal, an alloy, metal nitride, conductive metal oxide, a transparent conductive material, and the like. These may be used alone or in combination with each other. In other embodiments, the electrode pattern 305 may have a multilayer structure including a plurality of metal layers. For example, the metal layers may have mutually different thicknesses, or may include mutually different materials.

The pixel defining layer 310 may be disposed in the display area 10, the peripheral area 20, and the pad area 60 on the planarization layer 270. The pixel defining layer 310 may cover both side portions of the lower electrode 290, and may expose a part of a top surface of the lower electrode 290 to outside the pixel defining layer 310. In addition, the pixel defining layer 310 may cover both side portions of the electrode pattern 305, and may expose a part of a top surface of the electrode pattern 305 to outside the pixel defining layer 310. The pixel defining layer 310 may include or be formed of an organic insulating material or an inorganic insulating material. In the embodiments, the pixel defining layer 310 may include an organic insulating material.

The light emitting layer 330 may be disposed in the display area 10 on the pixel defining layer 310, the lower electrode 290, and a part of the electrode pattern 305. In other words, the light emitting layer 330 may not be disposed in a portion in which the power supply contact hole 651 is formed. That is, the light emitting layer 330 may be spaced apart from the power supply contact hole 651 in a direction along the pixel defining layer 310. At the power supply contact hole 651, the electrode pattern 305 may be exposed outside of the light emitting layer 330. The light emitting layer 330 may have a multilayer structure including an organic light emission layer ("EML"), a hole injection layer ("HIL"), a hole transport layer ("HTL"), an electron transport layer ("ETL"), an electron injection layer ("EIL"), and the like. The organic light emission layer ("EML") of the light emitting layer 330 may be provided or formed by using at least one of light emitting materials for emitting different color lights (e.g., a red light, a green light, a blue light, etc.) according to sub-pixels.

Alternatively, the organic light emission layer ("EML") of the light emitting layer 330 may be provided or formed by stacking a plurality of light emitting materials for generating different color lights such as a red light, a green light, and a blue light to emit a white light as a whole. In this case, a color filter may be disposed on the light emitting layer 330 disposed on the lower electrode 290. The color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed in the display area 10 on the substrate 110. In an embodiment, for example, the upper electrode 340 may be disposed on the light emitting layer 330 in the display area 10 to make direct contact with the electrode pattern 305 exposed outside of the light emitting layer 330. In other words, at the power supply contact hole 651, the upper electrode 340 may be disposed along a profile of the light emitting layer 330 and the electrode pattern 305. As described above, the power supply voltage applied to the inner power supply wire 710 from the outer periphery power supply wire 610 may be transmitted to the upper electrode 340 through the second connection pattern 655 and the electrode pattern 305. The upper electrode 340 may include a metal, an alloy, metal nitride, conductive metal oxide, a transparent conductive material, and the like. These may be used alone or in combination with each other. In other embodiments, the upper electrode 340 may have a multilayer structure including a plurality of metal layers. For example, the metal layers may have mutually different thicknesses, or may include mutually different materials.

Accordingly, the sub-pixel structure 200 including the lower electrode 290, the light emitting layer 330, and the upper electrode 340 may be provided.

An encapsulation substrate may be disposed in the display area 10 on the upper electrode 340. The encapsulation substrate may face the substrate 110, and may not be disposed in the pad area 60 (e.g., may be excluded from or terminate at the pad area 60). The encapsulation substrate may include substantially the same material as the substrate 110. In an embodiment, for example, the encapsulation substrate may include a quartz substrate, a synthetic quartz substrate, a calcium fluoride substrate, a fluorine-doped quartz substrate, a soda lime glass substrate, a non-alkali glass substrate, and the like. In other embodiments, the encapsulation substrate may include a transparent inorganic material or flexible plastic. In an embodiment, for example, the encapsulation substrate may include a transparent resin substrate having flexibility. In this case, in order to improve flexibility of the display device 100, the encapsulation substrate may have a structure in which at least one inorganic layer and at least one organic layer are alternately stacked. The stacked structure may include a first inorganic thin film encapsulation layer, an organic thin film encapsulation layer, and a second inorganic thin film encapsulation layer.

Referring again to FIGS. 5 and 6, an insulating layer structure 630 may be disposed on the outer periphery power supply wire 610. In an embodiment, for example, the insulating layer structure 630 may include a part of the gate insulating layer 150, a part of the interlayer insulating layer 190, a part of the protective layer 400, a part of the planarization layer 270, a part of the pixel defining layer 310, a part of the first or second inorganic thin film encapsulation layer, and the like, which are disposed in the display area 10 on the substrate 110. As shown in FIG. 6, the conductive film layer 510 may be interposed between the outer periphery power supply wire 610 disposed on the fourth display panel 104 and the outer periphery power supply wire 610 disposed on the second display panel 102. The outer periphery power supply wire 610 disposed on the fourth display panel 104 and the outer periphery power supply wire 610 disposed on the second display panel 102 may be electrically connected to each other by the conductive film layer 510. In addition, the conductive film layer 510 may bond the second display panel 102 to the fourth display panel 104 at a boundary therebetween. A structure similar to that shown in FIG. 5 may be used electrically connect and bond other display panels adjacent to each other at respectively boundaries therebetween.

However, although embodiments of the display device 100 have been described as specifically being an organic light emitting diode display device including an organic light emitting diode as a light emitting element (e.g., sub-pixel structure 200), the configuration is not limited thereto. In other embodiments, the display device 100 may include a liquid crystal display device ("LCD"), a field emission display device ("FED"), a plasma display device ("PDP"), or an electrophoretic display device ("EPD").

Figure 8:
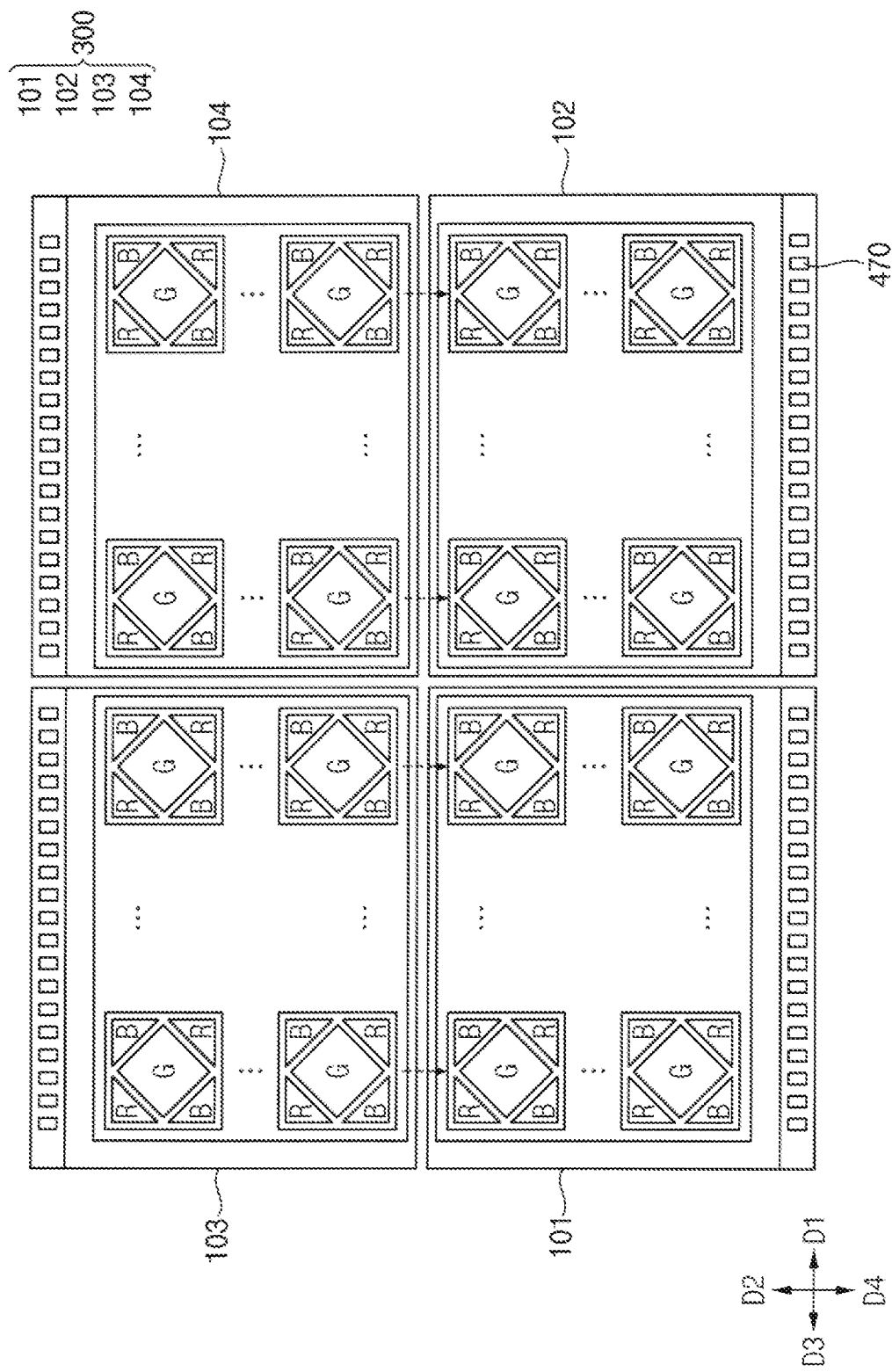
FIG. 8 is a plan view for describing an embodiment of an arrangement of sub-pixel areas included in a pixel area of FIG. 1.
Figure 9:
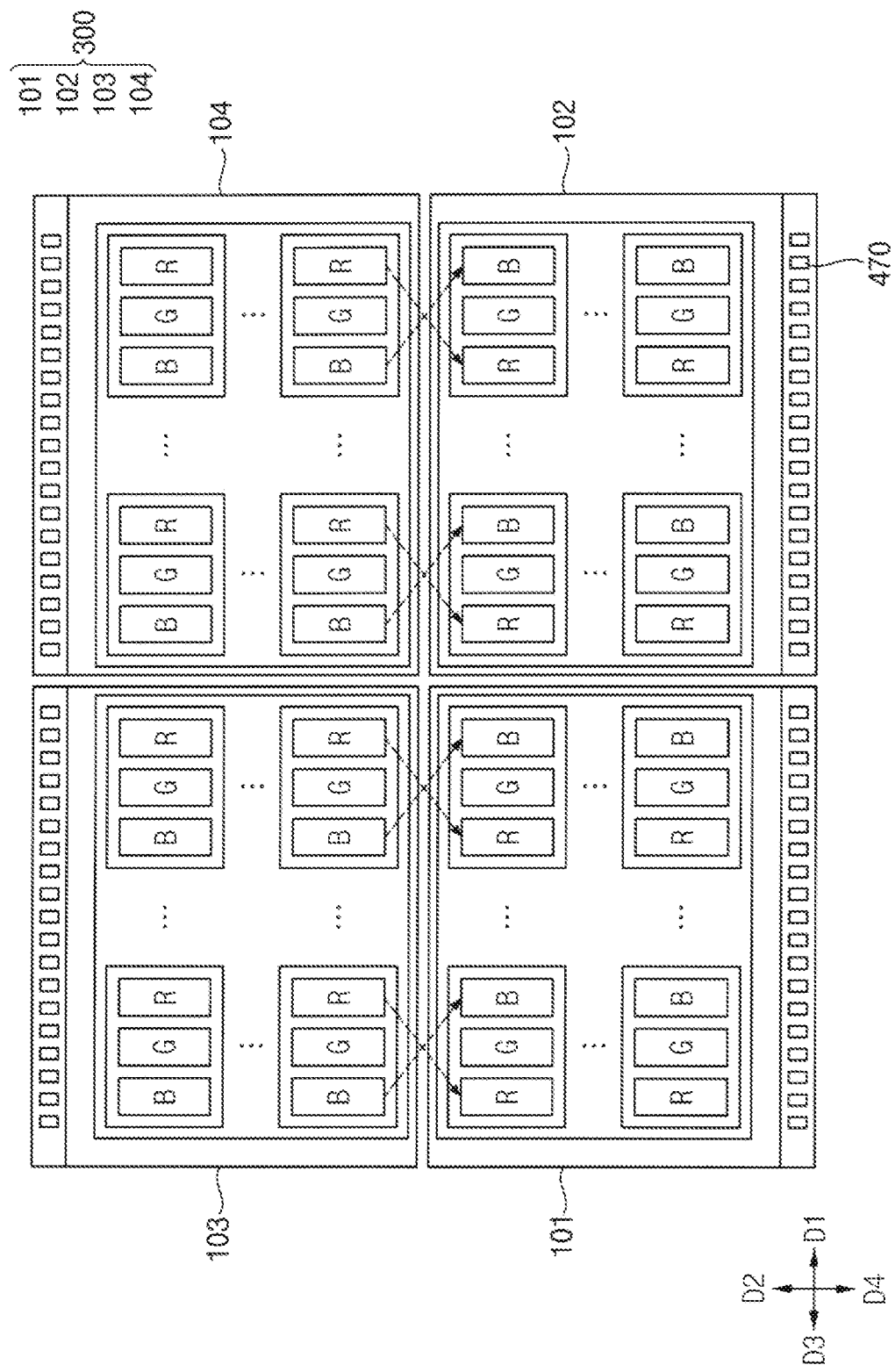
FIGS. 9 and 10 are plan views for describing arrangements of sub-pixel areas included in a pixel area according to comparative examples.
Figure 10:
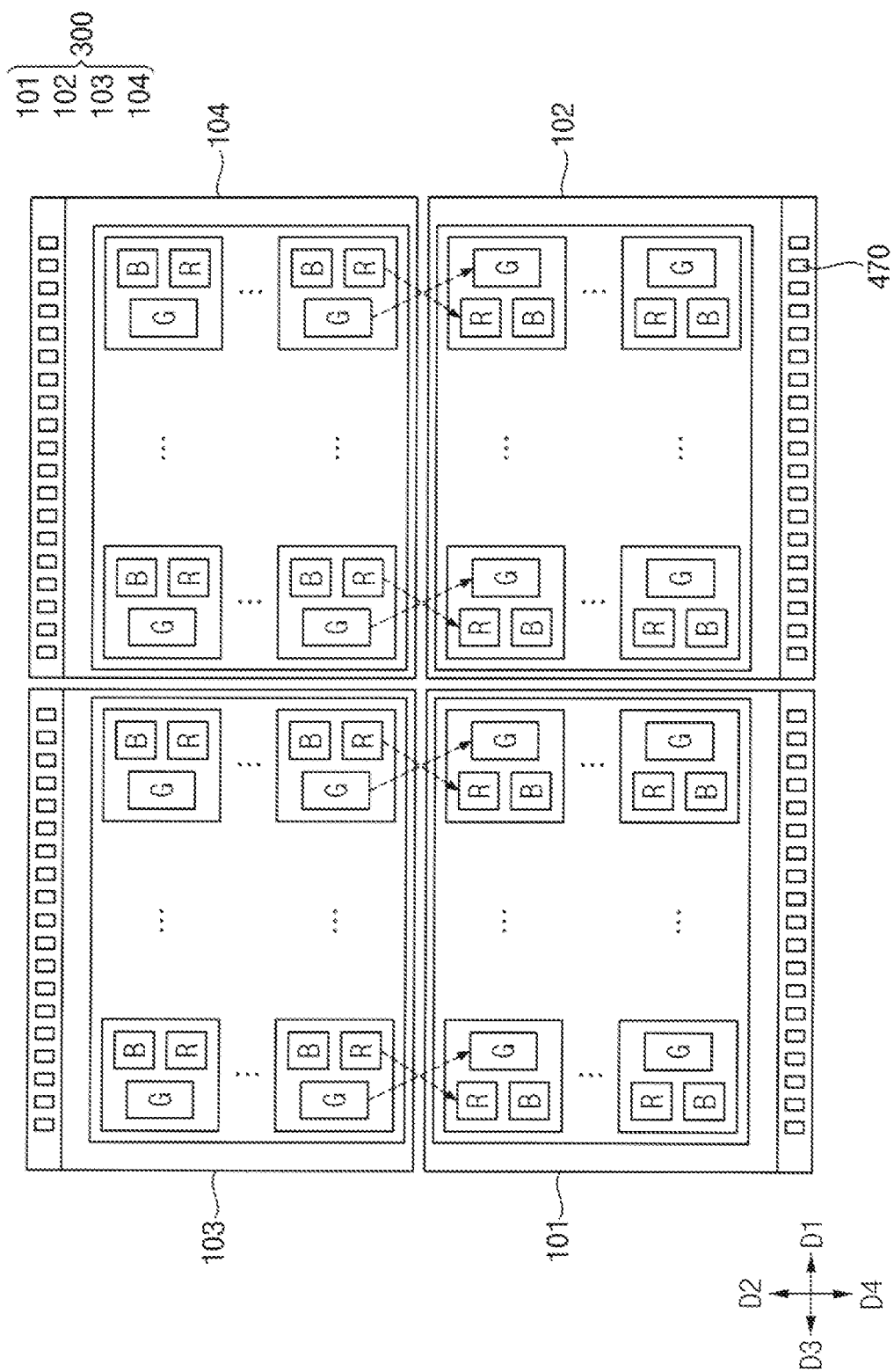

FIG. 8 is a plan view for describing an embodiment of an arrangement of sub-pixel areas included in a pixel area 30 of FIG. 1, and FIGS. 9 and 10 are plan views for describing comparative arrangements of sub-pixel areas included in a pixel area 30.

Referring to FIGS. 8, 9, and 10, various arrangements of sub-pixel areas included in a pixel area 30 are shown in FIGS. 8, 9, and 10. FIG. 8 shows the pixel areas 30 including the first sub-pixel area 31, the second sub-pixel areas 32, and the third sub-pixel areas 33 in the display device 100 shown in FIGS. 1 to 7. FIG. 9 shows pixel areas 30 including sub-pixel areas having an RGB stripe structure. FIG. 10 shows pixel areas 30 including sub-pixel areas having an S-stripe structure (e.g., a structure including a green sub-pixel having a relatively large area). As described above, a shape of a respective sub-pixel area may be the same as a shape of a respective sub-pixel, and pixels having such sub-pixel areas may be changed to pixels having different colors based on the pixel structure including the pixel area 30.

The tiled display structure 300 having the sub-pixel arrangements shown in FIGS. 9 and 10 may be configured such that the arrangement of the pixels adjacent or closest to the boundary between the first display panel 101 and the third display panel 103 and the arrangement of the pixels adjacent or closest to the boundary between the second display panel 102 and the fourth display panel 104 may be different from each other. Since the arrangement of the pixels at respective boundaries is changed, unnaturalness of an image may be visually recognized from outside the tiled display structure 300 such as by the user of the display device 100.

In contrast, the tiled display structure 300 having the sub-pixel arrangement shown in FIG. 8 may be configured such that the arrangement of the pixels adjacent or closest to the boundary between the first display panel 101 and the third display panel 103 and the arrangement of the pixels adjacent or closest to the boundary between the second display panel 102 and the fourth display panel 104 may not be changed at respective boundaries between adjacent display panels.

In other words, when the first to fourth display panels 101, 102, 103, and 104 of the same reference orientation are used to implement the tiled display structure 300 having the sub-pixel arrangement shown in FIG. 8, unnaturalness of an image may not be visually recognized from outside the tiled display structure 300 such as by the user of the display device 100 at the respective boundaries.

Figure 11:
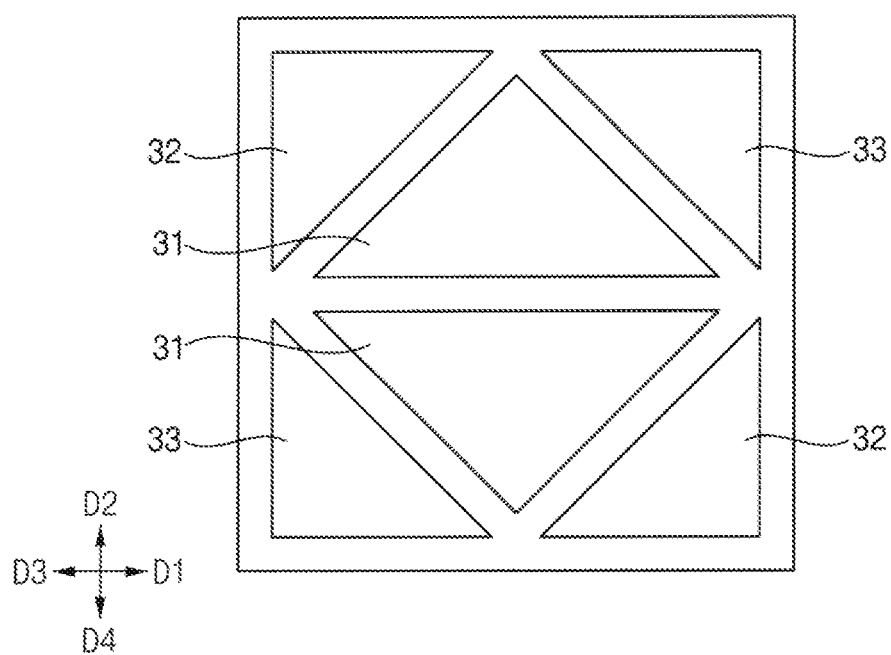
FIG. 11 is a plan view showing an embodiment of the pixel area of FIG. 3.

FIG. 11 is a plan view showing an embodiment an arrangement of sub-pixel areas included in a pixel area 30 of FIG. 2.

Referring to FIG. 11, the pixel area 30 may include the first sub-pixel 31 provided in plural including a plurality of first sub-pixel areas 31, a plurality of second sub-pixel areas 32, and a plurality of third sub-pixel areas 33. When compared to the pixel area 30 of FIG. 3, the pixel area 30 of FIG. 11 may be configured such that a collective one of the first sub-pixel area 31 is configured in the form of two triangular planar areas when viewed in a plan view.

Figure 12:
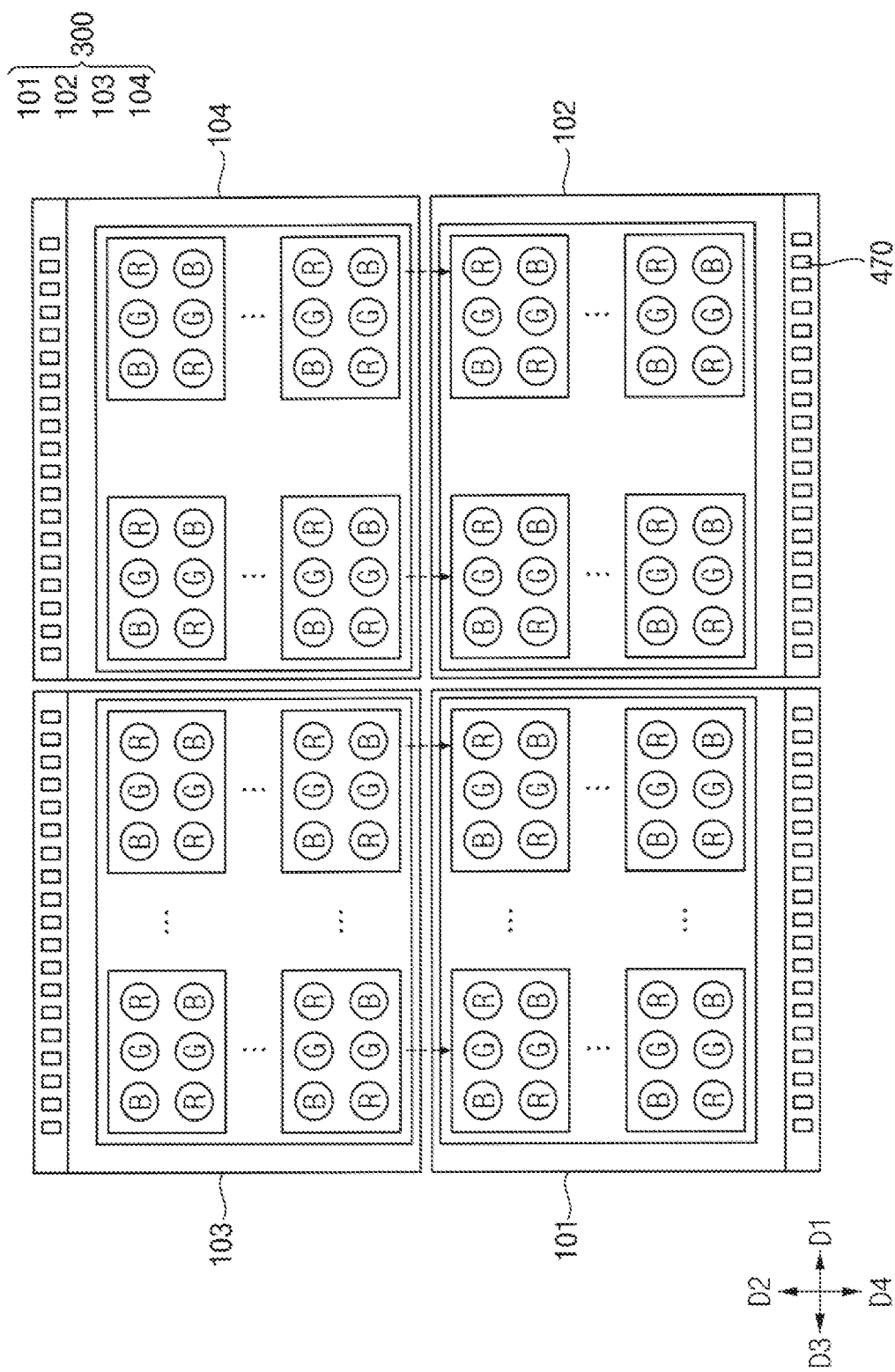
FIG. 12 is a plan view showing an embodiment of the arrangement of the sub-pixel areas included in the pixel area of FIG. 8.

FIG. 12 is a plan view showing an embodiment of the arrangement of the sub-pixel areas included in the pixel area 30 of FIG. 8.

Referring to FIG. 12, the pixel area 30 may include sub-pixel areas configured in two rows and three columns. In an embodiment, for example, a first row may include a blue sub-pixel, a green sub-pixel, and a red sub-pixel in order along a direction, and a second row may include a red sub-pixel, a green sub-pixel, and a blue sub-pixel in order along the same direction. The tiled display structure 300 having the above sub-pixel arrangement may be configured such that the arrangement of the pixels adjacent to the boundary between the first display panel 101 and the third display panel 103 and the arrangement of the pixels adjacent to the boundary between the second display panel 102 and the fourth display panel 104 may not be changed at respective boundaries between adjacent display panels. A reference orientation of the pixel area 30 in FIG. 12 may include each of a first sub-pixel area 31, a second sub-pixel area 32 and a third sub-pixel area 33 closest to an outer edge of the pixel area 30 which is closest to a respective boundary between adjacent display panels. The reference orientation of the pixel area 30 may include each of the first sub-pixel area 31, the second sub-pixel area 32 and the third sub-pixel area 33 arranged at reference locations within the pixel area 30.

However, although the sub-pixel area has been shown in the drawing as having a circular shape when viewed in a plan view, the configuration is not limited thereto. In an embodiment, for example, the planar shape of the sub-pixel area may have a triangular shape, a rhombic shape, a polygonal shape, a rectangular shape, an elliptical shape, or a track shape when viewed in a plan view.

FIG. 13 is a plan view showing an embodiment of a display device 700. A display device 700 illustrated in FIG. 13 may have a configuration that is substantially identical or similar to the configuration of the display device 100 described with reference to FIGS. 1 to 8 except for a connection wire 720 and the inner power supply wire 710. In FIG. 13, redundant descriptions of components that are substantially identical or similar to the components described with reference to FIGS. 1 to 8 will be omitted.

Referring to FIG. 13, when compared to the display device 100, the display device 700 may further include the inner power supply wire 710 and the connection wire 720.

The connection wire 720 may connect the first input parts 621a, 621b, 621c, and 621d to the second input parts 622a, 622b, 622c, and 622d. The connection wire 720 and the outer periphery power supply wire 610 may together surround an outermost periphery of the tiled display structure 300 which is defined by the first to fourth display panels 101, 102, 103, and 104 together within the tiled display structure 300.

The inner power supply wire 710 may be disposed in a lattice shape in the display area 10 of each of the first to fourth display panels 101, 102, 103, and 104. The inner power supply wire 710 may be connected to both the connection wire 720 and the outer periphery power supply wire 610.

The outer periphery power supply wire 610 may be separated or disconnected between the first display panel 101 and each of the second and third display panels 102 and 103, respectively, and between the fourth display panel 104 and each of the second and third display panels 102, respectively, to define a space between respective display panels adjacent to each other. The conductive film layer 510 may be interposed in the space obtained by the separation between the respective power supply wires of adjacent display panels. The inner power supply wire 710, the connection wire 720, and the outer periphery power supply wire 610 disposed on the first to fourth display panels 101, 102, 103, and 104 may all conduct electricity through the conductive film layer 510 owing to an electrical connection with the conductive film layer 510 at the space obtained by the separation between the respective power supply wires of adjacent display panels.

FIGS. 14 to 18 are views showing an embodiment of a method of manufacturing a display device 100. FIGS. 17 and 18 may be view corresponding to lines I-I' and II-II' of FIG. 1.

Figure 14:
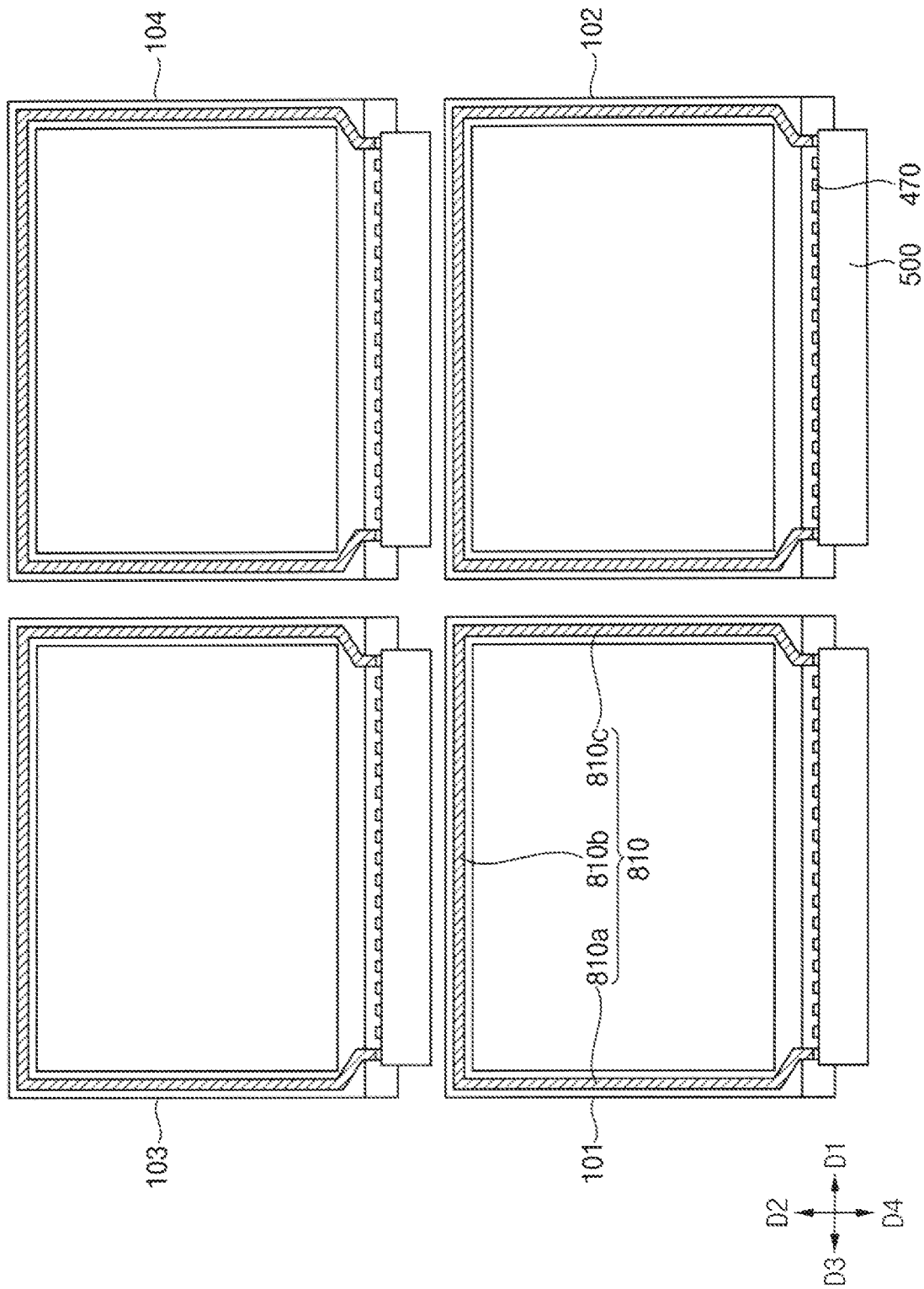

Referring to FIG. 14, first to fourth display panels 101, 102, 103, and 104 having the same structure may be provided. Each of the first to fourth display panels 101, 102, 103, and 104 may include a power supply wire 810, a pad electrode 470, a printed circuit board 500, and the like. In this case, the power supply wire 810 may include a first extension part 810*a*, a second extension part 810*b*, and a third extension part 810*c*. In an embodiment, for example, the first extension part 810*a* may be disposed on a left side of a peripheral area 20 of each of the first to fourth display panels 101, 102, 103, and 104, the second extension part 810*b* may be disposed on an upper portion of the peripheral area 20 of each of the first to fourth display panels 101, 102, 103, and 104, and the third extension part 810*c* may be disposed on a right side of the peripheral area 20 of each of the first to fourth display panels 101, 102, 103, and 104. A portion of the peripheral area 20 and the second extension part 810*b* are at a side of each of the first to fourth display panels 101, 102, 103, and 104 which is furthest from the pad area 60. FIG. 14 may show a same structure of the first to fourth display panels 101, 102, 103, and 104 each in a reference orientation from which a display panel within the tiled display structure 300 may be rotated. The reference orientation may include the display area 10, the peripheral area 20 and the pad area 60 in order in a single direction, for example, in the fourth direction D4.

Referring to FIG. 15, the third display panel 103 may be rotated by 180 degrees with respect to the first display panel 101 in the reference orientation, and the fourth display panel 104 may be rotated by 180 degrees with respect to the second display panel 102 in the reference orientation. In other words, the first to fourth display panels 101, 102, 103, and 104 may be arranged in the form of a lattice having two rows and two columns. After the first to fourth display panels 101, 102, 103, and 104 are arranged, a part of each of the first to fourth display panels 101, 102, 103, and 104 may be removed such at by cutting along a plurality of cutting lines including a first cutting line CL1, a second cutting line CL2, a third cutting line CL3, and a fourth cutting line CL4.

In a tiled display structure 300, each display panel may have an edge which faces an adjacent display panel (e.g., a facing edge). A boundary between adjacent display panels within the tiled display structure 300 may be defined at the facing edges of the display panels. Referring to FIG. 15, portions of the first cutting line CL1 and the third cutting line CL3 correspond to facing edges of the first display panel 101. Portions of the second cutting line CL2 and the third cutting line CL3 correspond to facing edges of the second display panel 102. Portions of the first cutting line CL1 and the fourth cutting line CL4 correspond to facing edges of the third display panel 103. Portions of the second cutting line CL2 and the fourth cutting line CL4 correspond to the facing edges of the fourth display panel 104.

Figure 16:
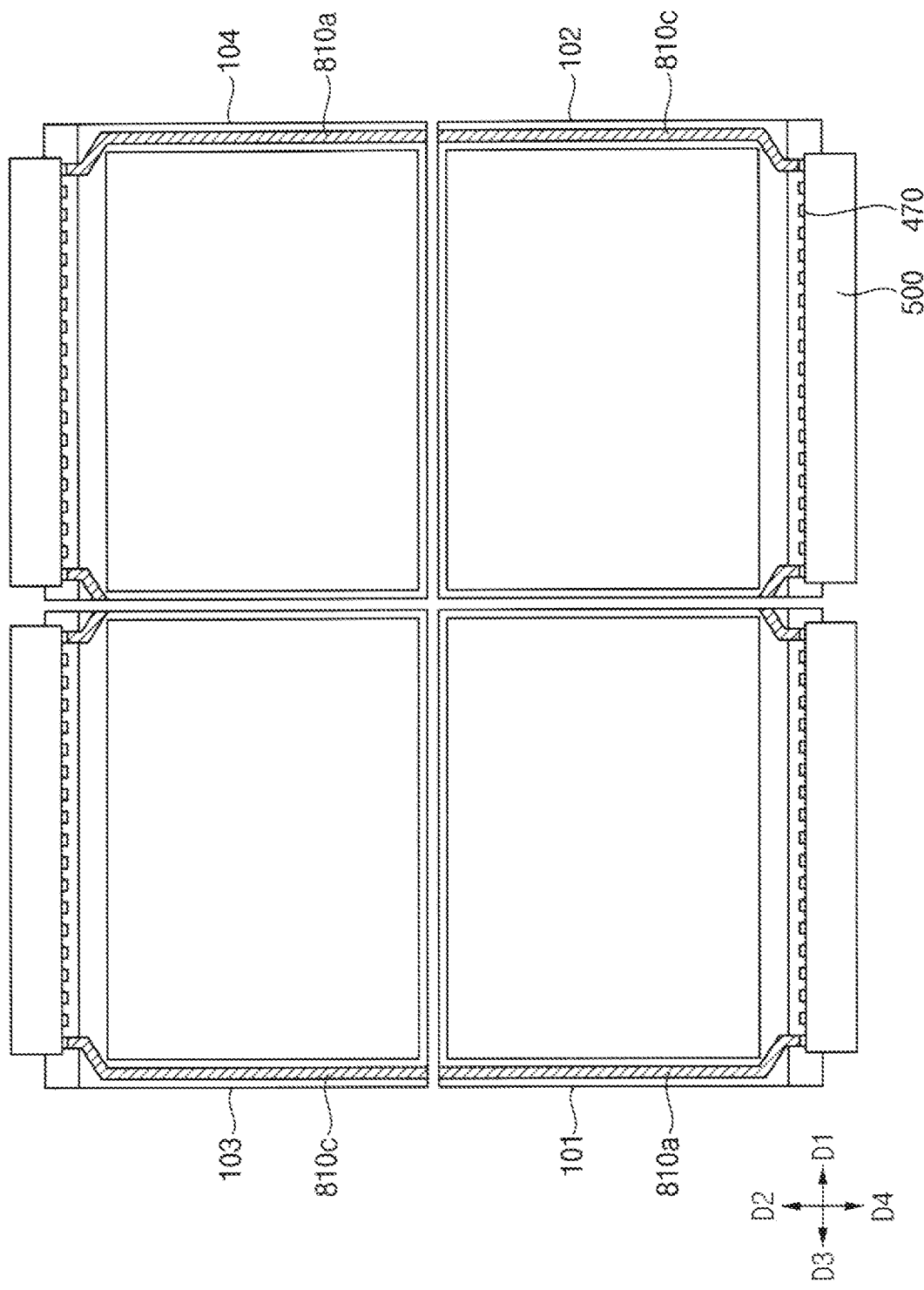

Referring to FIGS. 16, 17, and 18, since a part of each of the first to fourth display panels 101, 102, 103, and 104 is removed along the first cutting line CL1, the second cutting line CL2, the third cutting line CL3, and the fourth cutting line CL4, the second extension part 810*b* and the third extension part 810*c* of the first display panel 101 may be removed, the first extension part 810*a* and the second extension part 810*b* of the second display panel 102 may be removed, the first extension part 810*a* and the second extension part 810*b* of the third display panel 103 may be removed, and the second extension part 810*b* and the third extension part 810*c* of the fourth display panel 104 may be removed. Removal of portions of the peripheral area 20 including the various parts of the power supply wire 810 defines the facing edges of the first to fourth display panels 101, 102, 103, and 104.

Referring to FIGS. 16, 17, and 18 again, facing edges of display panels may respectively include facing end surfaces of one or more layers of the display panels. FIG. 17 shows facing edges corresponding to the first cutting line CL1 and the second cutting line CL2, each defined by end surfaces of the insulating structure 630 and the substrate 110 at a boundary between the first display panel 101 and the second display panel 102. Similarly, FIG. 18 shows facing edges corresponding to the third cutting line CL3 and the fourth cutting line CL4 each defined by end surfaces of the insulating structure 630, the outer periphery power supply wire 610 and the substrate 110 at a boundary between the second display panel 102 and the fourth display panel 104. A gap or space is defined at each of the boundaries.

Referring back to FIGS. 1, 5, and 6, the conductive film layer 510 may be interposed at the removed portions of the various display panels, and the first to fourth display panels 101, 102, 103, and 104 may be connected to each other through the conductive film layer 510.

Accordingly, the display device 100 shown in FIGS. 1 to 8 may be provided or manufactured.

According to one or more embodiment of the method of manufacturing (or providing) the display device 100, the tiled display structure 300 is provided manufactured by using the first to fourth display panels 101, 102, 103, and 104 having the same structure, so that the tiled display structure 300 may be implemented without using different-structure display panels. Accordingly, a manufacturing cost of the display device 100 may be relatively reduced.

One or more embodiments may be applied to various electronic devices including a display device 100. In embodiments, for example, the display device 100 may be applied to numerous electronic devices such as vehicle-display devices, ship-display devices, aircraft-display devices, portable communication devices, exhibition display devices, information transfer display devices, medical-display devices, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
   a tiled display structure including:
      first to fourth display panels each including:
         a display area including a plurality of pixels; and
         a pad area extended from the display area in a first direction along a column direction, to define a reference orientation of the each display panel,
      wherein, in each of the plurality of pixels, a first arrangement of sub-pixels is defined along a row direction crossing the column direction, and a second arrangement of sub-pixels is defined along the column direction,
      wherein the first display panel and the second display panel are adjacent along the row direction,
      wherein the third display panel and the fourth display panel are adjacent along the row direction, wherein the first display panel and the third display panel are adjacent along the column direction, the third display panel being rotated 180 degrees from the reference orientation, wherein the second display panel and the fourth display panel are adjacent along the column direction, the fourth display panel being rotated 180 degrees from the reference orientation, and wherein the first arrangement and the second arrangement of sub-pixels in the first and second display panels, are the same as the first arrangement and the second arrangement of sub-pixels in the third and fourth display panels.

2. The display device of claim 1, further comprising within the tiled display structure a conductive film layer between the first display panel and the second display panel, between the first display panel and the third display panel, between the fourth display panel and the second display panel and between the fourth display panel and the third display panel.

3. The display device of claim 2, wherein within the tiled display structure:
the first display panel and the third display panel are symmetrical with each other about the conductive film layer between the first display panel and the third display panel; and
the second display panel and the fourth display panel are symmetrical with each other about the conductive film layer between the second display panel and the fourth display panel.

4. The display device of claim 2, wherein within the tiled display structure:
the first display panel and the second display panel are symmetrical with each other about the conductive film layer between the first display panel and the second display panel; and
the third display panel and the fourth display panel are symmetrical with each other about the conductive film layer between the third display panel and the fourth display panels.

5. The display device of claim 2, wherein the tiled display structure further includes:
the first to fourth display panels together defining an outermost periphery of the tiled display structure; and
an outer periphery power supply wire and a connection wire which together surround the outermost periphery of the tiled display structure.

6. The display device of claim 5, wherein the outer periphery power supply wire is disconnected between the first display panel and the second display panel, between the first display panel and the third display panel, between the fourth display panel and the second display panel, and between the fourth display panel and the third display panel.

7. The display device of claim 6, wherein the tiled display structure further includes an inner power supply wire which has a lattice shape in the display area of each of the first to fourth display panels and is electrically connected to the outer periphery power supply wire.

8. The display device of claim 1, wherein within the tiled display structure:
each of the first display panel, the second display panel, the third display panel and the fourth display panel further includes the pad area extended from the display area to define a plurality of pad areas;
the first to fourth display panels together define an outermost periphery of the tiled display structure; and
the plurality of pad areas are arranged at the outermost periphery of the tiled display structure.

9. The display device of claim 8, wherein the pad area of the first display panel and the pad area of the third display panel face each other along the column direction.

10. The display device of claim 8, wherein at the outermost periphery of the tiled display structure:
the pad area of the first display panel and the pad area of the second display panel are arranged along the row direction; and
the pad area of the third display panel and the pad area of the fourth display panel are arranged along the row direction.

11. The display device of claim 10, wherein
the pad area of the first display panel and the pad area of the second display panel extend along the row direction; and
the pad area of the third display panel and the pad area of the fourth display panel extend along the row direction.

12. The display device of claim 8, wherein the pad area of the second display panel and the pad area of the fourth display panel face each other along the column direction.

13. The display device of claim 1, wherein
each of the plurality of pixels includes:
a first sub-pixel having a rectangular shape including a first side, a second side, a third side and a fourth side;
second sub-pixels respectively adjacent to the first side of the first sub-pixel and the second side of the first sub-pixel which faces the first side of the first sub-pixel, and each having a triangular shape; and
third sub-pixels respectively adjacent to the third side of the first sub-pixel and the fourth side of the first sub-pixel which faces the third side of the first sub-pixel, and each having a triangular shape; and
the two sub-pixels which are repeated along both the row direction and the column direction include one of the second sub-pixels and one of the third sub-pixels at a same side of the each pixel.

14. The display device of claim 1, wherein each of the first display panel, the second display panel, the third display panel and the fourth display panel further includes:
the pad area extended from the display area; and
a pad electrode in the pad area of each of the first to fourth display panels.

15. The display device of claim 1, wherein the first to fourth display panels are arranged in two rows and two columns.

16. The display device of claim 1, further comprising within the tiled display structure:
a boundary between adjacent display panels among the first to fourth display panels, the boundary extending along both the row direction and the column direction; and
pixels which are closest to the boundary among the plurality of pixels include the two sub-pixels arranged repeated along the boundary in both the row direction and the column direction.

17. The display device of claim 1, further comprising within the tiled display structure:
each of the plurality of pixels including:
a first sub-pixel having a shape including a first side, a second side, a third side and a fourth side, and a first color;
second sub-pixels respectively adjacent to the first side of the first sub-pixel and the second side of the first sub-pixel which faces the first side of the first sub-pixel, and each having a second color different from the first color; and third sub-pixels respectively adjacent to the third side of the first sub-pixel and the fourth side of the first sub-pixel which faces the third side of the first sub-pixel, and each having a third color different from the first color and the second color;

wherein the two sub-pixels which are repeated along both the row direction and the column direction include one of the second sub-pixels and one of the third sub-pixels at a same side of the first sub-pixel among the first to fourth sides thereof;

a boundary between adjacent display panels among the first to fourth display panels, the boundary extending along both the row direction and the column direction; and pixels which are closest to the boundary among the plurality of pixels include the two sub-pixels arranged repeated along the boundary in both the row direction and the column direction.

18. A display device comprising:

a tiled display structure including:
  a first display panel and a second display panel adjacent along a row direction;
  a third display panel and a fourth display panel adjacent along the row direction;
  the first display panel and the third display panel adjacent along a column direction crossing the row direction;
  the second display panel and the fourth display panel adjacent along the column direction;
  the first to fourth display panels together defining an outermost periphery of the tiled display structure;
  a boundary between adjacent display panels among the first to fourth display panels, the boundary extending along both the row direction and the column direction; and
  at the boundary extending along the row direction and along the column direction, the display panels which are adjacent to each other are respectively spaced apart from each other to define a space therebetween;
a conductive film layer in the space between the display panels which are respectively spaced apart from each other;
an outer periphery power supply wire and a connection wire which together surround the outermost periphery of the tiled display structure, the outer periphery power supply wire being disconnected between the first display panel and the second display panel, between the first display panel and the third display panel, between the fourth display panel and the second display panel, and between the fourth display panel and the third display panel; and the outer periphery power supply wire and the connection wire are electrically connected to each other through the conductive film layer.

19. A display device comprising:

a tiled display structure including:
  a first display panel and a second display panel adjacent along a row direction;
  a third display panel and a fourth display panel adjacent along the row direction;
  the first display panel and the third display panel adjacent along a column direction crossing the row direction;
  the second display panel and the fourth display panel adjacent along the column direction;
  the first to fourth display panels together defining an outermost periphery of the tiled display structure;
  each of the first display panel, the second display panel, the third display panel and the fourth display panel including:
    a display area including a plurality of pixels; and
    a pad area extended from the display area to define a plurality of pad areas of the display device which are arranged at the outermost periphery of the tiled display structure;
a first outer periphery power supply wire extending from the pad area of the third display panel to the pad area of the first display panel; and
a second outer periphery power supply wire extending from the pad area of the fourth display panel to the pad area of the second display panel.

20. The display device of claim 19, wherein the first outer periphery power supply wire extends along a same side of both the third display panel and the first display panel; and the second outer periphery power supply wire extends along a same side of both the fourth display panel and the second display panel.

* * * * *